(12) United States Patent
Yang

(10) Patent No.: US 12,745,400 B2
(45) Date of Patent: Sep. 22, 2026

(54) MEMORY DEVICE WITH A BLOCKING LAYER BETWEEN A SOURCE CONTACT AND A SUPPORT PILLAR

(71) Applicant: MACRONIX INTERNATIONAL CO., LTD., Hsinchu (TW)

(72) Inventor: Chih-Kai Yang, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 461 days.

(21) Appl. No.: 18/453,353

(22) Filed: Aug. 22, 2023

(65) Prior Publication Data

US 2025/0071999 A1 Feb. 27, 2025

(51) Int. Cl.

| | |
|---|---|
| ***H10B 43/35*** | (2023.01) |
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |

(52) U.S. Cl.

CPC ......... *H10B 43/35* (2023.02); *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02)

(58) Field of Classification Search

CPC ............................ H10B 43/35; G11C 16/0483

See application file for complete search history.

(56) References Cited

U.S. PATENT DOCUMENTS 10,224,340 B2 3/2019 Hada et al.
11,380,629 B2 7/2022 Zhang et al.
2018/0366486 A1* 12/2018 Hada ...................... H10B 41/27
2018/0374869 A1* 12/2018 Kim ..................... H10D 62/151
2021/0210425 A1* 7/2021 Lee ........................ H10B 43/10
2021/0225862 A1* 7/2021 Zhang .................... H10B 43/27

(Continued)

FOREIGN PATENT DOCUMENTS

CN 110462829 A 11/2019
CN 115955841 A 4/2023

(Continued)

*Primary Examiner* — Peter Bradford

(74) *Attorney, Agent, or Firm* — McClure, Qualey & Rodack, LLP

(57) ABSTRACT

A memory device includes a substrate, a bottom source structure, gate layers, dielectric layers, a contact structure and a plurality of support pillar structures. The bottom source structure is located over the substrate. The bottom source structure includes a bottom electrode layer, a dielectric stack structure and a blocking structure. The gate layers and the dielectric layers are alternately stacked over the bottom source structure. The contact structure penetrates through the gate layers and the dielectric layers and extends to the bottom source structure. The support pillar structure penetrates through the gate layers and the dielectric layers and extends to the bottom source structure. The dielectric stack structure of the bottom source structure surrounds each of the support pillar structures. The blocking structure of the bottom source structure is located between one of the support pillar structures and the contact structure.

14 Claims, 16 Drawing Sheets

(56) References Cited

U.S. PATENT DOCUMENTS

| | | | | |
|---|---|---|---|---|
| 2021/0335801 | A1* | 10/2021 | Yang | H10B 43/10 |
| 2023/0106571 | A1 | 4/2023 | Shen et al. | |
| 2024/0324202 | A1* | 9/2024 | Kim | H10B 43/27 |
| 2024/0324205 | A1* | 9/2024 | Kang | H10B 41/27 |

FOREIGN PATENT DOCUMENTS

| | | | |
|---|---|---|---|
| TW | 202207375 | A | 2/2022 |
| TW | 202211447 | A | 3/2022 |

* cited by examiner 100
180
170
A
160
150
140
DS
153
O1
W1
151
T1
SR
AR
A
130
120
110
D1
D2

100
O1a
O1b
O1
150
SR
S1
S1'
A1
A1'
AR
D1
D2

100
190
170
160
150
140
DS
W1
O1
T2
195'
SR
AR
T1
130
120
110
D2
D1

100
O1
190
S1
S1'
A1
A1'
SR
AR
D1
D2

MEMORY DEVICE WITH A BLOCKING LAYER BETWEEN A SOURCE CONTACT AND A SUPPORT PILLAR

BACKGROUND

Technical Field

The present disclosure relates to a memory device and a manufacturing method of the memory device.

Description of Related Art

In semiconductor industry, the structures of memory devices have been changed constantly, and the storage capacity of the memory devices has been increased continuously. Memory devices are used in storage elements for many products such as MP3 players, digital cameras, computer files, and so on. As the application increases, the demand for the memory devices focuses on small size and large memory capacity. For satisfying the requirement, a memory device having a high element density, a small size and a solid structure are in need. Therefore, it is important to provide robust processes in the manufacture of the memory devices.

SUMMARY

One aspect of the present disclosure is a memory device.

According to some other embodiments of the present disclosure, a memory device includes a substrate, a bottom source structure, a plurality of gate layers, a plurality of dielectric layers, a contact structure and a plurality of support pillar structures. The bottom source structure is located over the substrate, in which the bottom source structure includes a bottom electrode layer, a dielectric stack structure and a blocking structure. The gate layers and the dielectric layers are alternately stacked over the bottom source structure. The contact structure penetrates through the gate layers and the dielectric layers and extends to the bottom source structure. The support pillar structure penetrates through the gate layers and the dielectric layers and extends to the bottom source structure. The dielectric stack structure of the bottom source structure surrounds each of the support pillar structures, and the blocking structure of the bottom source structure is located between one of the support pillar structures and the contact structure.

In some embodiments of the present disclosure, the blocking structure is in contact with the dielectric stack structure and the contact structure.

In some embodiments of the present disclosure, the bottom source structure further includes a first conductive layer and a second conductive layer over the first conductive layer, and the blocking structure is located between the first conductive layer and the second conductive layer.

In some embodiments of the present disclosure, the contact structure extends along a first direction, and a first portion the blocking structure is adjacent to a section of the contact structure along the first direction.

In some embodiments of the present disclosure, the blocking structure further includes a second portion extending along a second direction perpendicular to the first direction.

In some embodiments of the present disclosure, the memory device further includes a memory structure. The memory structure penetrates through the gate layers and the dielectric layers over an array region. The contact structure extends along the first direction over the array region and a staircase region including the support pillar structures.

In some embodiments of the present disclosure, the memory structure is electrically connected to the bottom electrode layer.

In some embodiments of the present disclosure, the dielectric stack structure of the bottom source structure includes a first oxide layer, a nitride layer over the first oxide layer, and a second oxide layer over the nitride layer.

Another aspect of the present disclosure is a memory device.

According to some embodiments of the present disclosure, a memory device includes a substrate, a bottom source structure, a plurality of gate layers, a plurality of dielectric layers, a contact structure and a support pillar structure. The bottom source structure is located over the substrate, in which the bottom source structure includes a bottom electrode layer and a dielectric stack structure. The gate layers and the dielectric layers are alternately stacked over the bottom source structure. The contact structure penetrates through the gate layers and the dielectric layers and extends to the bottom source structure. The support pillar structure penetrates through the gate layers and the dielectric layers and extends to the bottom source structure. The dielectric stack structure of the bottom source structure is laterally between a lower portion of the contact structure and a lower portion of the support pillar structure.

In some embodiments of the present disclosure, the bottom source structure further includes a first conductive layer and a second conductive layer over the first conductive layer, and the dielectric stack structure is vertically between the first conductive layer and the second conductive layer.

In some embodiments of the present disclosure, the bottom source structure further includes a blocking structure laterally adjacent to the dielectric stack structure.

In some embodiments of the present disclosure, the blocking structure of the bottom source structure surrounds the contact structure.

In some embodiments of the present disclosure, the blocking structure of the bottom source structure is in contact with the lower portion of the contact structure and spaced apart from the lower portion of the support pillar structure.

In some embodiments of the present disclosure, a bottom surface of the support pillar structure is below a bottom surface of the dielectric stack structure.

In some embodiments of the present disclosure, the dielectric stack structure is in contact with the lower portion of the support pillar structure.

Another aspect of the present disclosure is a manufacturing method of a memory device.

According to some other embodiments of the present disclosure, the manufacturing method of a memory device includes forming a first conductive layer, a dielectric stack structure and a second conductive layer over a substrate in sequence, in which the substrate has an array region and a staircase region. A blocking layer is formed over the second conductive layer. The blocking layer over the staircase region further penetrates through the second conductive layer and the dielectric stack structure. A plurality of dielectric layers and a plurality of sacrificial material layers are formed alternately stacked over the blocking layer. A memory structure is formed downwards penetrating through the dielectric layers, the sacrificial material layers, the blocking layer, the second conductive layer and the dielectric stack structure over the array region. The memory structure includes a memory element and a channel layer on the memory element. A support pillar structure is formed downwards penetrating through the dielectric layers, the sacrificial material layers, the blocking layer, the second conductive layer and the dielectric stack structure over the staircase region. A slit trench is formed downwards penetrating through the dielectric layers and the sacrificial material layers over the array region and the staircase region. The blocking layer and the second conductive layer are etched from the slit trench over the array region to expose the dielectric stack structure. The dielectric stack structure and the memory element of the memory structure over the array region are etched to expose the channel layer of the memory structure. A bottom electrode layer is formed electrically connected to the channel layer of the memory structure. The sacrificial material layers are replaced with a plurality of gate layers. A contact structure is formed in the slit trench.

In some embodiments of the present disclosure, the manufacturing method of the memory device further includes etching the blocking layer from the slit trench over the staircase region such that portions of the blocking layer remain vertically between the first conductive layer and the second conductive layer. Etching the blocking layer over the staircase region is performed such that the first conductive layer is exposed.

In some embodiments of the present disclosure, forming the blocking layer includes forming an opening downwards penetrating through the second conductive layer over the staircase region to expose the dielectric stack structure. The dielectric stack structure is etched to laterally expand a portion of the opening below the second conductive layer. A conductive material is filled in the opening and over the second conductive layer.

In some embodiments of the present disclosure, a width of the opening in the second conductive layer is greater than a thickness of the dielectric stack structure.

In some embodiments of the present disclosure, a thickness of the blocking layer over the second conductive layer is greater than half of the width of the opening in the second conductive layer.

BRIEF DESCRIPTION OF THE DRAWINGS

The disclosure can be more fully understood by reading the following detailed description of the embodiments, with reference made to the accompanying drawings as follows.

DETAILED DESCRIPTION

Figures 1A, 1B:
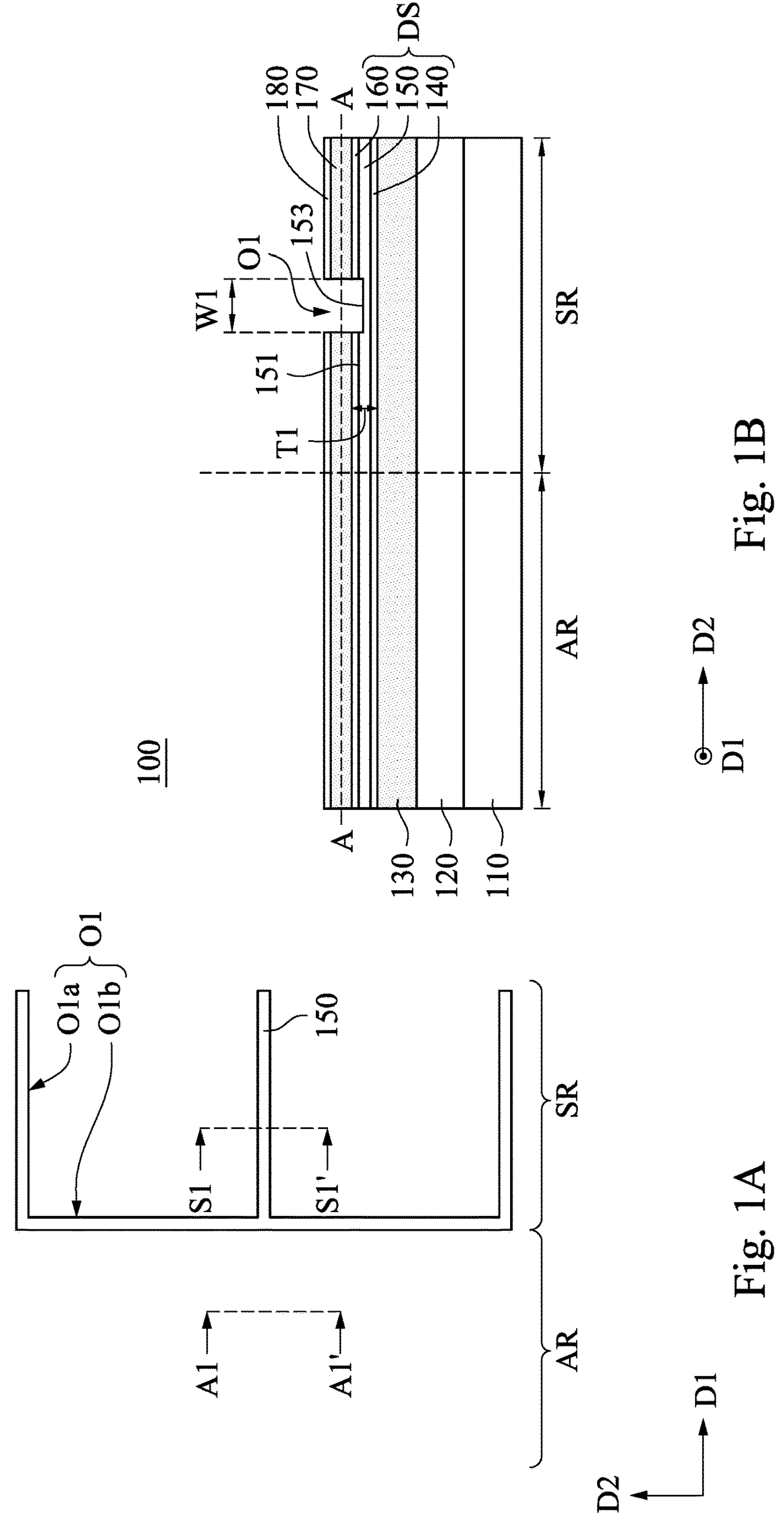
FIGS. 1A, 2A, 3A, 4A, 5A, 6A, 7A, 8A, 9A, 10A, 11A, 12A, 13A and 14A are top views of a process at various stages of a manufacturing method of a memory device according to some embodiments of the present disclosure.
FIGS. 1B, 2B, 3B, 4B, 5B, 6B, 7B, 8B, 9B, 10B, 11B, 12B, 13B and 14B are cross-sectional views of a process at various stages of a manufacturing method of a memory device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, “around”, “about”, “approximately”, or “substantially” shall generally mean within 10 percent, or within 5 percent of a given value or range. Numerical quantities given herein are approximated, meaning that the term “around”, “about”, “approximately”, or “substantially” can be inferred if not expressly stated.

In the embodiments of the present disclosure, a memory device and a manufacturing method of the same are provided. It is noted that the term “top view” may be used herein for ease of description to refer to as a cross-sectional view of a second conductive layer (i.e., the cross-section along line A-A in FIG. 1B) of the memory device in order to highlight the technical features of the inventive concept. Further, FIGS. 1A, 2A, 3A, 4A, 5A, 6A, 7A, 8A, 9A, 10A, 11A, 12A, 13A and 14A are top views of layouts of the memory device according to some embodiments of the present disclosure, and some elements are not illustrated in those top views for simplicity. FIGS. 1A-1B, 2A-2B, 3A-3B, 4A-4B, 5A-5B, 6A-6B, 7A-7B, 8A-8B, 9A-9B, 10A-10B, 11A-11B, 12A-12B, 13A-13B and 14A-14C are views of a process at various stages of a manufacturing method of a memory device 100 according to some embodiments of the present disclosure.

FIG. 1A is a top view of a step of manufacturing the memory device 100, and FIG. 1B is a cross-sectional view of the memory device 100 over an array region AR and a staircase region SR respectively taken along line A1-A1' and line S1-S1' in FIG. 1A. Referring to FIGS. 1A and 1B, a substrate 110 is provided. The substrate 110 has the array region AR and the staircase region SR, in which a memory array is formed over the array region AR of the substrate 110. The staircase region SR is adjacent to the array region AR.

An isolation layer 120 is formed on the substrate 110. Then, a first conductive layer 130, a dielectric stack structure DS, a second conductive layer 170 and an isolation layer 180 are formed over the substrate 110 in sequence. In some embodiments, the first conductive layer 130, the dielectric stack structure DS and the second conductive layer 170 are referred as a bottom stack structure. In some other embodiments, the first conductive layer 130, the dielectric stack structure DS, the second conductive layer 170 and the isolation layer 180 are referred as the bottom stack structure. The bottom stack structure extends along a plane defined by a first direction D1 and a second direction D2, in which the first direction D1 is perpendicular to the second direction D2. The isolation layer 120 is in contact with the substrate 110. The first conductive layer 130 is in contact with the isolation layer 120. The dielectric stack structure DS is in contact with the first conductive layer 130. The second conductive layer 170 is in contact with the dielectric stack structure DS. The isolation layer 180 is in contact with the second conductive layer 170. In some embodiments, forming the dielectric stack structure DS includes forming a first dielectric layer 140, a second dielectric layer 150 and a third dielectric layer 160 in sequence. The first dielectric layer 140 is in contact with the first conductive layer 130 and the third dielectric layer 160 is in contact with the second conductive layer 170.

After forming the isolation layer 180 over the substrate 110, an opening O1 is formed downwards penetrating through the isolation layer 180, the second conductive layer 170 and the third dielectric layer 160 of the dielectric stack structure DS and exposing the second dielectric layer 150 of the dielectric stack structure DS. In some embodiments, forming the opening O1 further includes etching a portion of the second dielectric layer 150 such that an exposed surface

153 of the second dielectric layer 150 is below a top surface 151 of the second dielectric layer 150 (or a bottom surface of the third dielectric layer 160). In some embodiments, a patterned photoresist is formed on the isolation layer 180, in which the patterned photoresist may be formed by suitable deposition, development and/or etching techniques. Then, the isolation layer 180, the second conductive layer 170 and the third dielectric layer 160 of the dielectric stack structure DS not covered by the patterned photoresist are etched by using the patterned photoresist as an etching mask to form the opening O1. After the opening O1 are formed, the patterned photoresist may be removed by using a photoresist stripping process (e.g., ashing process).

As shown in FIG. 1A, the opening O1 is located over the staircase region SR and spaced apart from the array region AR. The opening O1 may include first portions O1*a* and a second portion O1*b* perpendicular to the first portion O1*a*. Specifically, the first portions O1*a* extend along the first direction D1 and the second portion O1*b* extends along the second direction D2. The first portions O1*a* are connected to the second portion O1*b*. The opening O1 has a comb shape profile in the top view.

In some embodiments, the substrate 110 is a semiconductor substrate, such as a silicon substrate, a silicon germanium substrate, a silicon carbide substrate, or the like. The substrate 110 may include interconnect structures having conductive contacts, transistors, or other similar components. In some embodiments, the isolation layer 120 includes oxide (e.g., silicon oxide). In some embodiments, the first conductive layer 130 and the second conductive layer 170 includes the same material. For example, the first conductive layer 130 and the second conductive layer 170 include semiconductor materials (e.g., polysilicon). In some embodiments, the first dielectric layer 140 is a first oxide layer, the second dielectric layer 150 is a nitride layer and the third dielectric layer 160 is a second oxide layer. In some embodiments, the isolation layer 180 includes oxide (e.g., silicon oxide). In some embodiments, the isolation layer 120 and the isolation layer 180 include the same material (e.g., oxide).

Figures 2A, 2B:
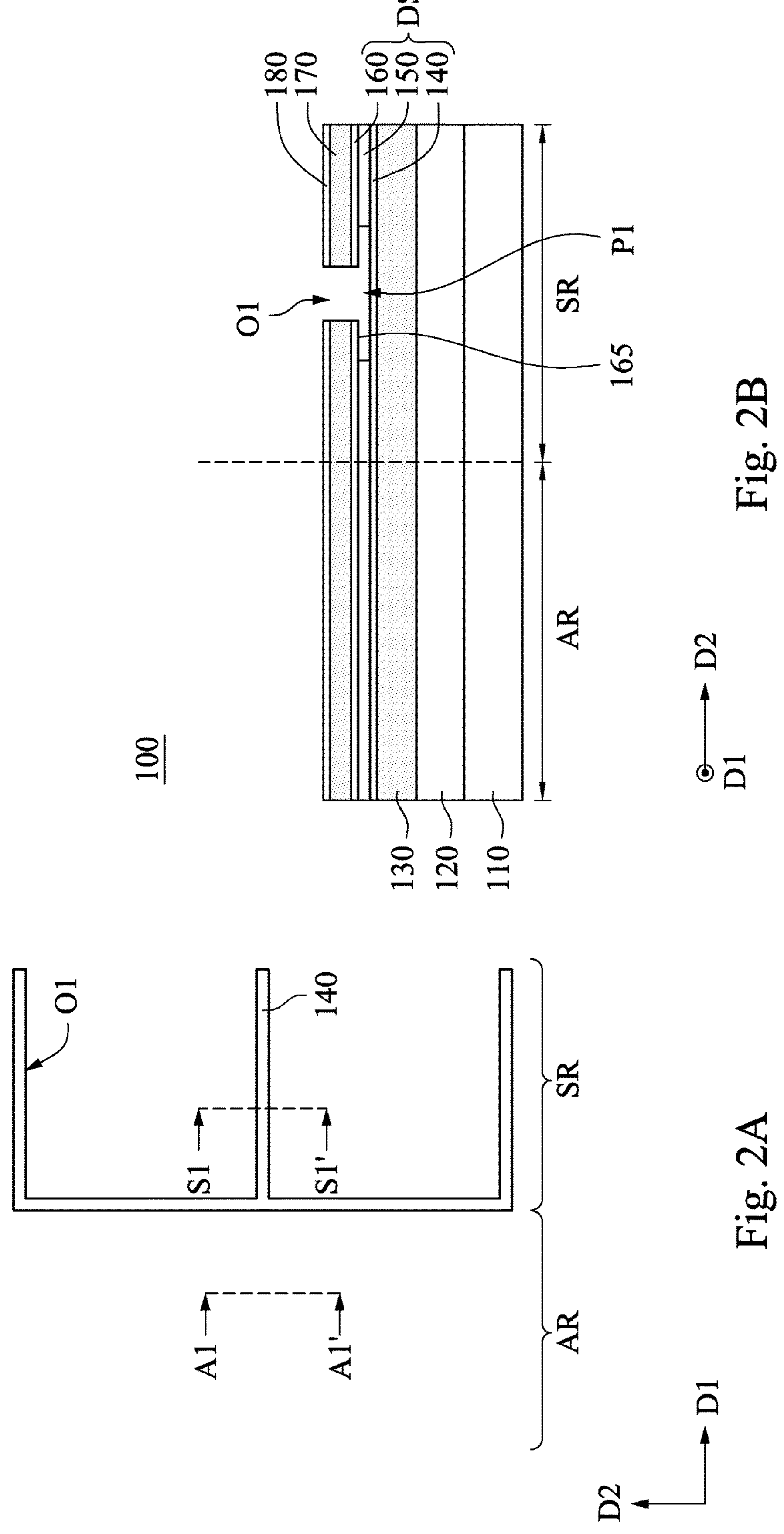
Figures 3A, 3B:
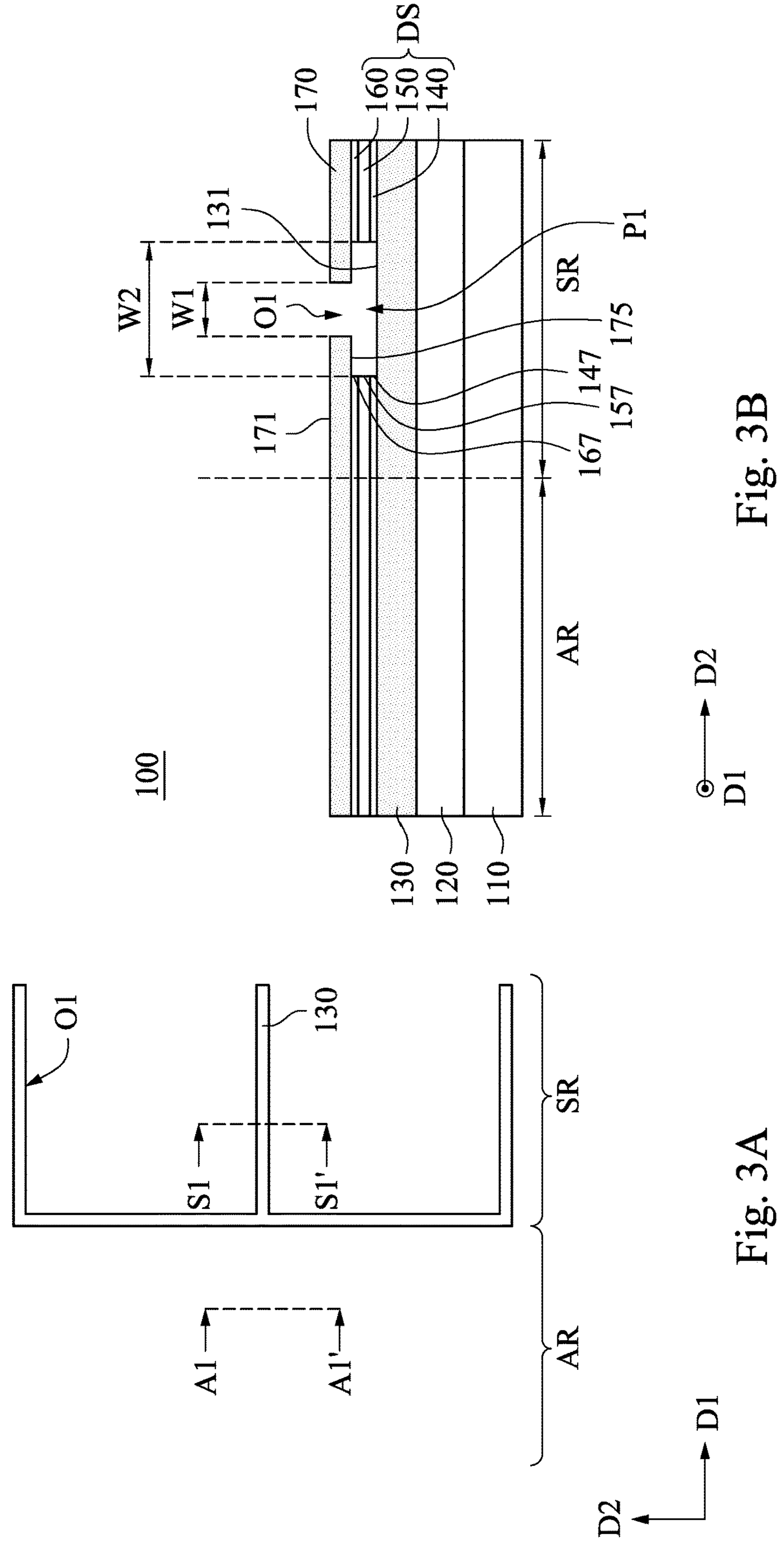

FIG. 2A is a top view of a step of manufacturing the memory device 100, and FIG. 2B is a cross-sectional view of the memory device 100 over the array region AR and the staircase region SR respectively taken along line A1-A1' and line S1-S1' in FIG. 2A. FIG. 3A is a top view of a step of manufacturing the memory device 100, and FIG. 3B is a cross-sectional view of the memory device 100 over the array region AR and the staircase region SR respectively taken along line A1-A1' and line S1-S1' in FIG. 3A. Referring to FIGS. 2A-2B and 3A-3B, after forming the opening O1, the dielectric stack structure DS is etched to laterally expand a portion P1 of the opening O1 below the second conductive layer 170. In greater details, as shown in FIGS. 2A and 2B, a first etching process is performed to the second dielectric layer 150 such that a bottom surface 165 of the third dielectric layer 160 is exposed. In some embodiments, the first etching process is a dry etching process, a wet etching process, or a combination thereof. In some embodiments, since the second dielectric layer 150 and the first dielectric layer 140 (or the third dielectric layer 160) have different etching selectivity, the second dielectric layer 150 is etched and the first dielectric layer 140 (or the third dielectric layer 160) are kept substantially intact (not etched) during the first etching process. That is, the first dielectric layer 140, the third dielectric layer 160, the second conductive layer 170, and the isolation layer 180 have higher etching resistance to the first etching process than the second dielectric layer 150.

As shown in FIGS. 2A-2B and 3A-3B, after performing the first etching process, a second etching process is performed to expose a bottom surface 175 of the second conductive layer 170 and a top surface 131 of the first conductive layer 130. In greater details, performing the second etching process includes etching the third dielectric layer 160 and the first dielectric layer 140 of the dielectric stack structure DS. In some embodiments, performing the second etching process further includes etching the isolation layer 180 such that a top surface 171 of the second conductive layer 170 is exposed. During the second etching process, because the first dielectric layer 140, the third dielectric layer 160, and the isolation layer 180 are made of the same material, such as oxide, the first dielectric layer 140, the third dielectric layer 160, and the isolation layer 180 may be etched simultaneously. After performing the second etching process, the opening O1 exposes a sidewall 147 of the first dielectric layer 140, a sidewall 157 of the second dielectric layer 150 and a sidewall 167 of the third dielectric layer 160. The sidewall 147, the sidewall 157 and the sidewall 167 are substantially aligned with each other. As a result of the first and second etching processes, the opening O1 has a first width W1 in the second conductive layer 170 and a second width W2 in the dielectric stack structure DS. The second with W2 of the opening O1 is greater than the first width W1 of the opening O1. In some embodiments, the second etching process is a dry etching process, a wet etching process, or a combination thereof. In some embodiments, since the first dielectric layer 140 (or the third dielectric layer 160) and the second dielectric layer 150 and have different etching selectivity, the first dielectric layer 140 (or the third dielectric layer 160) is etched and the second dielectric layer 150 is kept substantially intact (not etched) during the second etching process. That is, the second dielectric layer 150 and the second conductive layer 170 have higher etching resistance to the second etching process than the first dielectric layer 140, the third dielectric layer 160 and the isolation layer 180. In some embodiments, etchants of the second etching process is different from etchants of the first etching process.

Figures 4A, 4B:
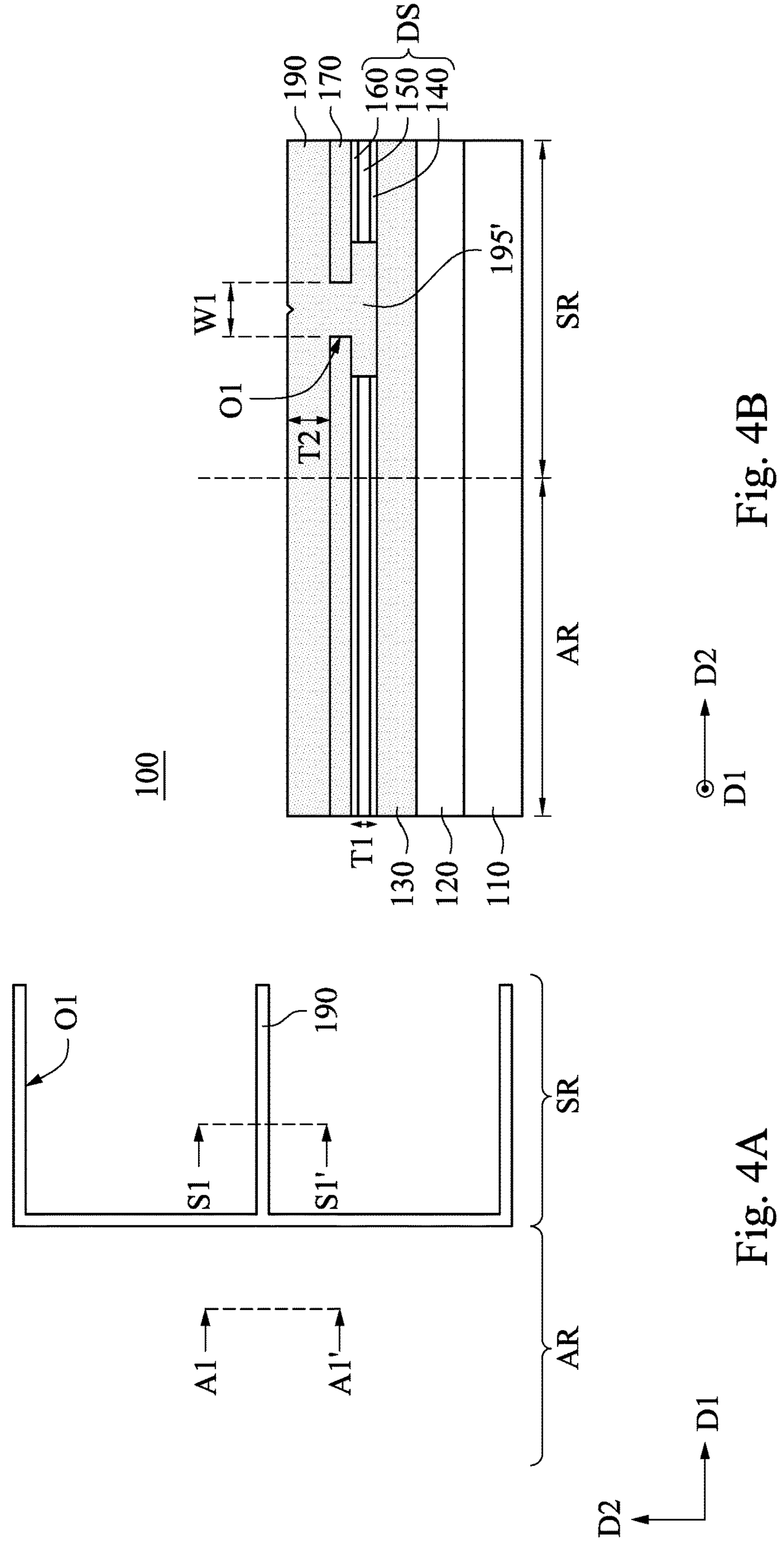

FIG. 4A is a top view of a step of manufacturing the memory device 100, and FIG. 4B is a cross-sectional view of the memory device 100 over the array region AR and the staircase region SR respectively taken along line A1-A1' and line S1-S1' in FIG. 4A. Referring to FIGS. 4A and 4B, after performing the second etching process, a conductive material is filled in the opening O1 and over the second conductive layer 170 to form a blocking layer 190. In other words, the second conductive layer 170 is covered by the blocking layer 190. The blocking layer 190 has a portion 195' over the staircase region SR and penetrating through the second conductive layer 170 and the dielectric stack structure DS. In some embodiments, since the conductive structure fills the opening O1, the blocking layer 190 in the second conductive layer 170 and the dielectric stack structure DS inherits the geometry of the opening O1. Stated differently, the blocking layer 190 in the second conductive layer 170 has the first width W1 and the blocking layer 190 in the dielectric stack structure DS has the second width W2 greater than the first width W1.

In some embodiments, as shown in FIGS. 3A-3B and 4A-4B, the first width W1 of the opening O1 in the second conductive layer 170 is greater than a thickness T1 of the dielectric stack structure DS. As a result, the opening O1 can be entirely filled with the conductive material and thus the blocking layer 190 has no void. If the first width W1 of the opening O1 in the second conductive layer 170 is smaller than the thickness T1 of the dielectric stack structure DS, the opening O1 in the second conductive layer 170 would be sealed by the conductive material too prematurely and thus void may be formed within a portion of the blocking layer 190 in the dielectric stack structure DS. In some embodiments, the first width W1 of the opening O1 (or the first width of the blocking layer 190) in the second conductive layer 170 is in a range from about 50 nanometers to about the 200 nanometers. If the first width W1 is smaller than 50 nanometers, the blocking layer 190 in the dielectric stack structure DS would have a void; if the first width W1 is greater than 200 nanometers, the blocking layer 190 over the second conductive layer 170 would be too thick.

In some embodiments, a thickness T2 of the blocking layer 190 over the second conductive layer 170 is greater than half of the first width W1 of the opening O1 in the second conductive layer 170. As a result, the opening O1 can be filled with the conductive material and thus the blocking layer 190 has no void. In some embodiments, the thickness T2 of the blocking layer 190 over the second conductive layer 170 is in a range from about 50 nanometers to about the 300 nanometers. If the thickness T2 of the blocking layer 190 is smaller than 50 nanometers, the blocking layer 190 in the dielectric stack structure DS would have a void; if the thickness T2 of the blocking layer 190 is greater than 300 nanometers, the blocking layer 190 would have worse electrical properties.

In some embodiments, filling the conductive material in the opening O1 to form the blocking layer 190 is performed by using a chemical vapor deposition, an atomic layer deposition, a physical vapor deposition, or other suitable deposition processes. In some embodiments, the blocking layer 190 and the second conductive layer 170 include the same material. For example, the blocking layer 190 and the second conductive layer 170 include a semiconductor material (e.g., polysilicon). In some embodiments, the blocking layer 190 and the first conductive layer 130 include the same material. For example, the blocking layer 190 and the first conductive layer 130 include a semiconductor material (e.g., polysilicon).

Figures 5A, 5B:
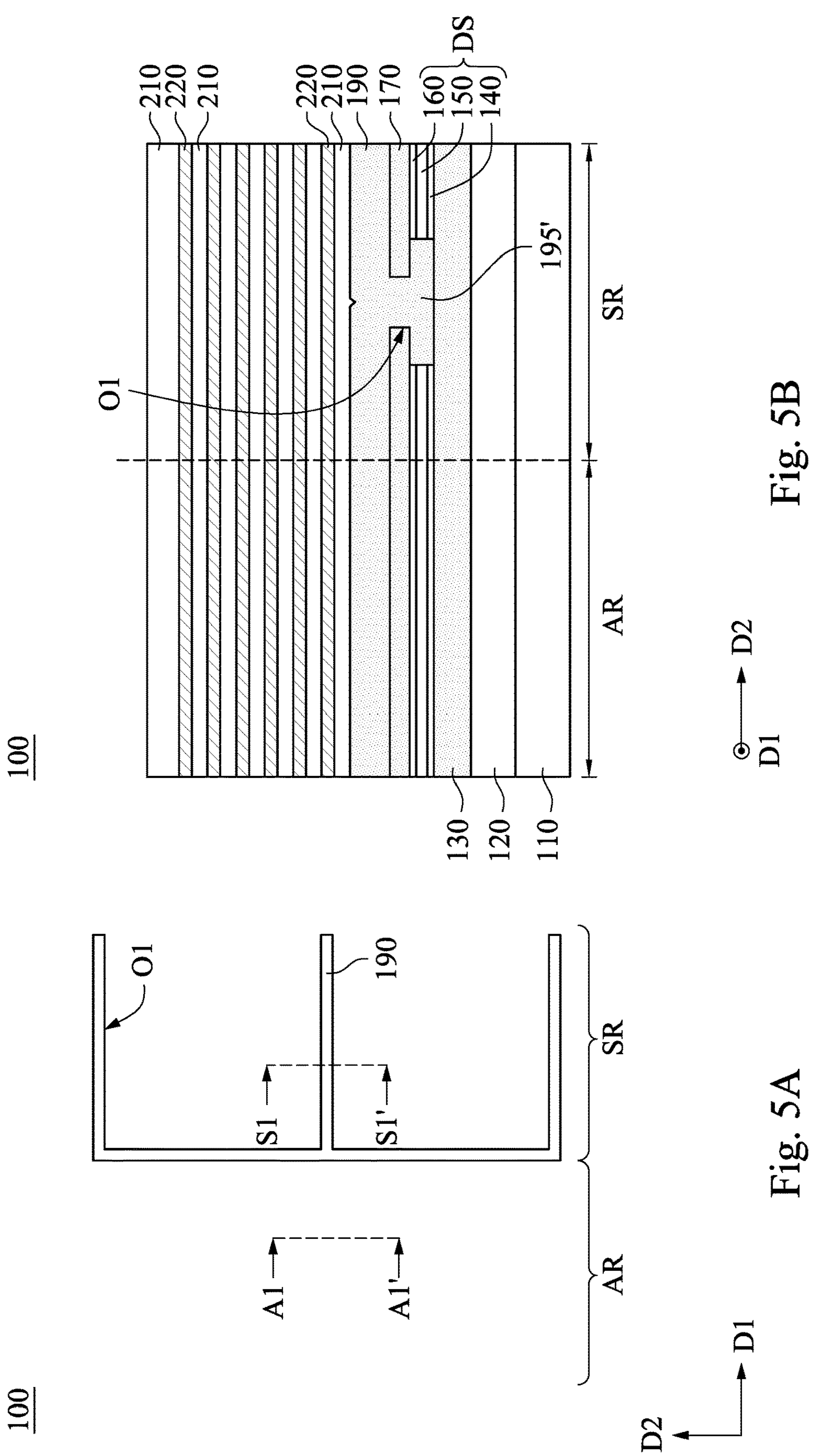

FIG. 5A is a top view of a step of manufacturing the memory device 100, and FIG. 5B is a cross-sectional view of the memory device 100 over the array region AR and the staircase region SR respectively taken along line A1-A1' and line S1-S1' in FIG. 5A. Referring to FIGS. 5A and 5B, a plurality of dielectric layers 210 and a plurality of sacrificial material layers 220 are formed interlaced and stacked over the blocking layer 190. The dielectric layers 210 and the sacrificial material layers 220 are alternately arranged over the blocking layer 190, and a bottommost layer of the dielectric layers 210 closest to the blocking layer 190 is in direct contact with the blocking layer 190. In some embodiments, the dielectric layers 210 and the sacrificial material layers 220 include different materials. For example, the dielectric layers 210 include oxide (e.g., silicon oxide), and the sacrificial material layers 220 include nitride (e.g., silicon nitride).

Figures 6A, 6B:
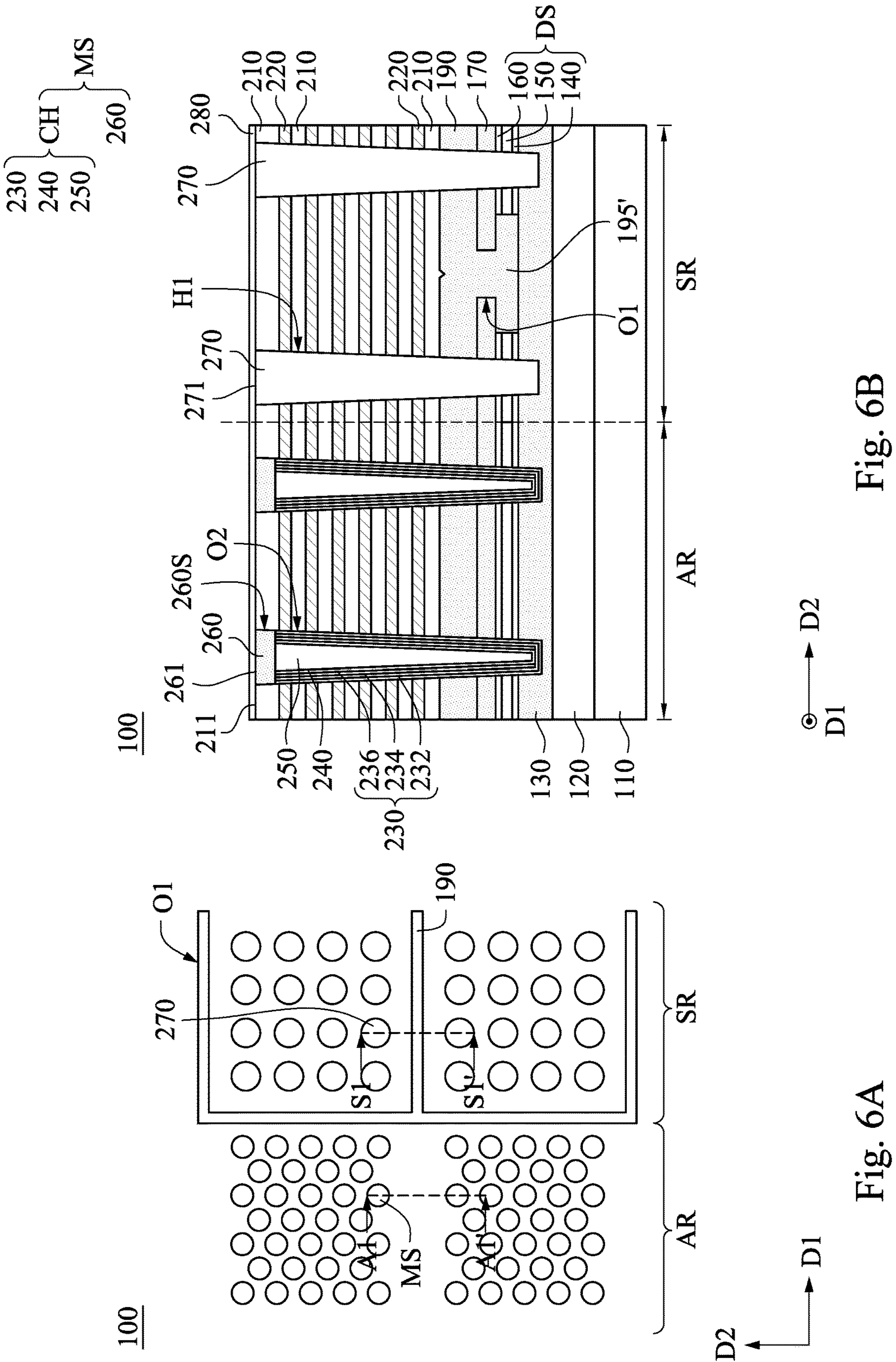

FIG. 6A is a top view of a step of manufacturing the memory device 100, and FIG. 6B is a cross-sectional view of the memory device 100 over the array region AR and the staircase region SR respectively taken along line A1-A1' and line S1-S1' in FIG. 6A. Referring to FIGS. 6A and 6B, after forming the dielectric layers 210 and the sacrificial material layers 220, a plurality of memory structures MS are formed downwards penetrating through the dielectric layers 210, the sacrificial material layers 220, the blocking layer 190, the second conductive layer 170 and the dielectric stack structure DS over the array region AR. In some embodiments, each of the memory structures MS has a portion embedded in the first conductive layer 130. Each of the memory structures MS includes a channel structure CH and a conductive plug 260 on the channel structure CH. Each of the channel structures CH includes a memory element 230, a channel layer 240 and the dielectric filling structure 250. The memory element 230 is in contact with the sacrificial material layers 220, the blocking layer 190, the second conductive layer 170, the dielectric stack structure DS and the first conductive layer 130. The channel layer 240 is in contact with the memory element 230, and the channel layer 240 is located between the memory element 230 and the dielectric filling structure 250. In some embodiments, the memory element 230 includes a blocking layer 232, a memory storage layer 234 and a tunneling layer 236. The blocking layer 232 is located on sidewalls of the dielectric layers 210, sidewalls of the sacrificial material layers 220, sidewalls of the blocking layer 190, sidewalls of the second conductive layer 170, sidewalls of the dielectric stack structure DS, sidewalls of the first conductive layer 130 and a surface of the first conductive layer 130. The memory storage layer 234 is located on the blocking layer 232, and the tunneling layer 236 is located on the memory storage layer 234. The blocking layer 232 and the tunneling layer 236 may include oxide (e.g., silicon oxide) or other suitable dielectric materials, and the memory storage layer 234 may include nitride (e.g., silicon nitride) or other material that is able to trap electrons. Accordingly, the memory element 230 may be a tri-layer structure of an oxide layer, a nitride layer and an oxide layer. The channel layer 240 may include polysilicon or other suitable semiconductor materials. The dielectric filling structure 250 may include oxide (e.g., silicon oxide) or other suitable dielectric materials. The conductive plug 260 may include polysilicon or other suitable semiconductor materials. The conductive plug 260 and the channel layer 240 may include the same material, such as semiconductor materials or polysilicon.

In some embodiments, forming the memory structures MS includes following steps. A plurality of openings O2 are formed downwards penetrating through the dielectric layers 210, the sacrificial material layers 220, the blocking layer 190, the second conductive layer 170 and the dielectric stack structure DS over the array region AR such that the first conductive layer 130 is exposed. The memory element 230 (including the blocking layer 232, the memory storage layer 234 and the tunneling layer 236) is formed on opposite sidewalls of the opening O2, but the opening O2 is still not entirely filled by the memory element 230. The channel layer 240 is then formed on sidewalls and a bottom of the memory element 230, but the opening O2 is still not entirely filled by the channel layer 240. Thereafter, a dielectric material is filled in the opening O2 to form the dielectric filling structure 250 on the channel layer 240. As such, the channel structure CH including the memory element 230, the channel layer 240 and the dielectric filling structure 250 are formed. After the channel structure CH (i.e., the memory element 230, the channel layer 240 and the dielectric filling structure 250) are formed, a space 260S is recessed to expose a top surface of the channel structure CH. Hence, the top surface of the channel structure CH is below a top surface 211 of the topmost layer of the dielectric layers 210. Then, a conductive material is filled in the space 260S to form the conductive plug 260 on the channel structure CH.

In other words, a top surface 261 of the conductive plug 260 is substantially coplanar with the top surface 211 of the topmost layer of the dielectric layers 210. As such, the memory structure MS including the channel structure CH (including the memory element 230, the channel layer 240 and the dielectric filling structure 250) and the conductive plug 260 is formed in the opening O2.

With respect to the staircase region SR, a plurality of support pillar structures 270 are formed downwards penetrating through the dielectric layers 210, the sacrificial material layers 220, the blocking layer 190, the second conductive layer 170 and the dielectric stack structure DS over the staircase region SR. In greater details, the dielectric layers 210, the sacrificial material layers 220, the blocking layer 190, the second conductive layer 170 and the dielectric stack structure DS over the staircase region SR are etched in advance to form holes H1 exposing the first conductive layer 130. Then, dielectric materials are filled in the holes H1 to form the support pillar structures 270. In some embodiments, each of the support pillar structures 270 has a portion embedded in the first conductive layer 130. In some embodiments, the support pillar structures 270 include oxide (e.g., silicon oxide) or other suitable dielectric materials. In some embodiments, forming the memory structure MS is performed prior to forming the support pillar structures 270. In some embodiments, as shown in FIG. 6A, each of the memory structures MS has a circular profile in the top view, and each of the support pillar structures 270 has a circular profile in the top view. In some embodiments, as shown in FIG. 6A, a diameter of each of the support pillar structures 270 is greater than a diameter of each of the memory structures MS.

Thereafter, an isolation layer 280 is formed on the topmost layer of the dielectric layers 210. In some embodiments, the support pillar structures 270 and the isolation layer 280 may be formed together using a single deposition process. In other words, the support pillar structures 270 and the isolation layer 280 include the same material. In some embodiments, the support pillar structures 270 and the isolation layer 280 include oxide (e.g., silicon oxide) or other suitable dielectric materials. In some embodiments, the support pillar structures 270, the isolation layer 280 and the dielectric layers 210 include the same material, such as oxide.

Figures 7A, 7B:
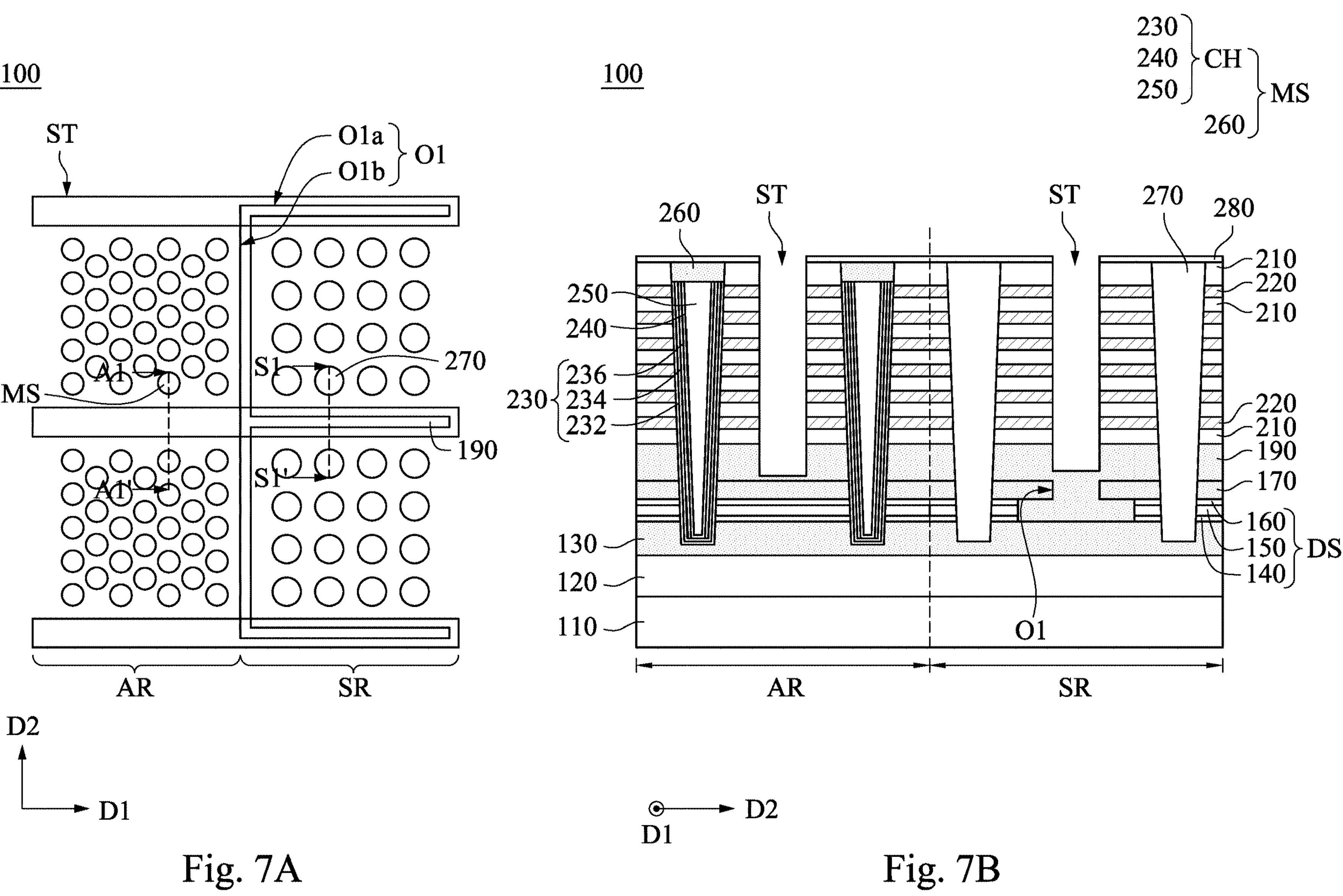

FIG. 7A is a top view of a step of manufacturing the memory device 100, and FIG. 7B is a cross-sectional view of the memory device 100 over the array region AR and the staircase region SR respectively taken along line A1-A1' and line S1-S1' in FIG. 7A. Referring to FIGS. 7A and 7B, after forming the memory structure MS and forming the support pillar structures 270, the dielectric layers 210 and the sacrificial material layers 220 are etched to form slit trenches ST downwards penetrating through the dielectric layers 210 and the sacrificial material layers 220 over the array region AR and the staircase region SR. In some embodiments, forming the slit trenches ST further includes etching the blocking layer 190 over the array region AR and the staircase region SR.

In some embodiments, as shown in FIG. 7A, each of the slit trenches ST extends between the array region AR and the staircase region SR and extends along the first direction D1. In some embodiments, as discussed above with respect to FIG. 1A, the opening O1 of forming the blocking layer 190 includes the first portions O1*a* along the first direction D1 and the second portion O1*b* along the second direction D2. The slit trenches ST are parallel with and overlap with the respective first portions O1*a* of the opening O1. The second portion O1*b* of the opening O1 is located between the memory structures MS and the support pillar structures 270.

Figure 15:
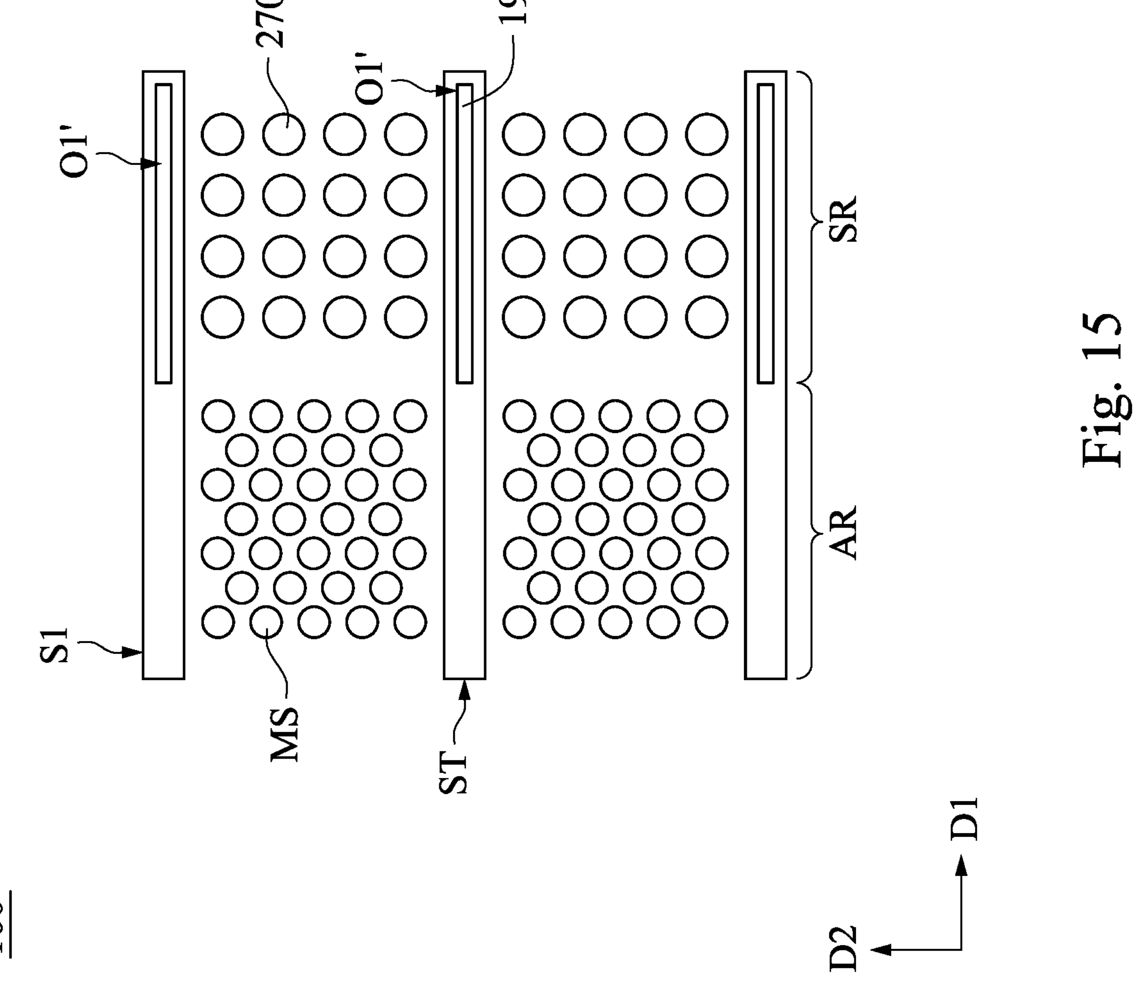
FIG. 15 is a top view of a memory device according to some embodiments of the present disclosure.

Now referring to FIG. 15, FIG. 15 is a top view of a memory device 100' according to some embodiments of the present disclosure. As shown in FIGS. 7A and 15, the memory device 100' of FIG. 15 is substantially the same as the memory device 100 of FIG. 7A, and the difference is profiles of openings O1' of forming the blocking layer 190. The openings O1' extend along the first direction D1. The slit trenches ST are respectively parallel with and overlap with the respective openings O1'. The openings O1' has no portion directly between the memory structures MS and the support pillar structures 270.

Figures 8A, 8B:
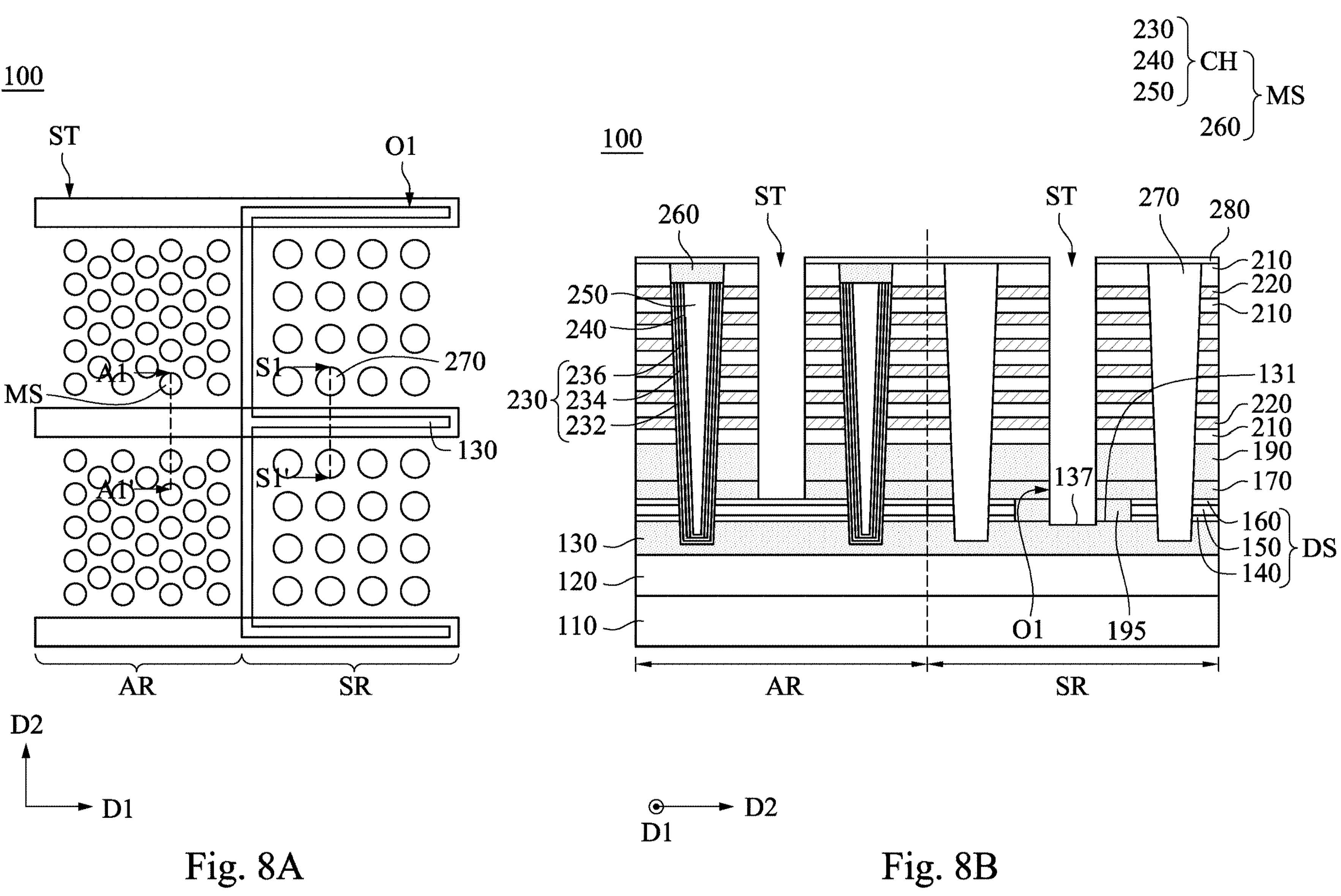

FIG. 8A is a top view of a step of manufacturing the memory device 100, and FIG. 8B is a cross-sectional view of the memory device 100 over the array region AR and the staircase region SR respectively taken along line A1-A1' and line S1-S1' in FIG. 8A. Referring to FIGS. 8A and 8B, an etching process is performed to further extend (or deepen) the slit trenches ST. With respect to the array region AR, the blocking layer 190 and the second conductive layer 170 are etched from the slit trenches ST, and the etching process may be stopped at the third dielectric layer 160 of the dielectric stack structure DS, because the third dielectric layer 160 may include a higher etching resistance to the etching process. With respect to the staircase region SR, first portions of the blocking layer 190 exposed through the slit trenches ST are removed, while leaving second portions of the blocking layer 190 not exposed through the slit trenches ST below the second conductive layer 170 remain after the etching process is complete. The remaining second portions of the blocking layer 190 are referred to as blocking structures 195. In other words, the remaining second portions of the blocking layer 190 between the first conductive layer 130 and the second conductive layer 170 are referred as the blocking structures 195. The blocking structures 195 are in contact with the dielectric stack structure DS. After etching the blocking layer 190 over the array region AR and the staircase region SR, the first conductive layer 130 over the array region AR is still covered by the dielectric stack structure DS, while the first conductive layer 130 over the staircase region SR is exposed. In some embodiments, a portion of the first conductive layer 130 over the staircase region SR is etched such that an exposed surface 137 of the first conductive layer 130 is below the top surface 131 of the first conductive layer 130 that is in contact with the blocking structures 195. In some embodiments, etching the blocking layer 190 over the array region AR and the staircase region SR is performed by using a dry etching process, a wet etching process, or a combination thereof.

Figures 9A, 9B:
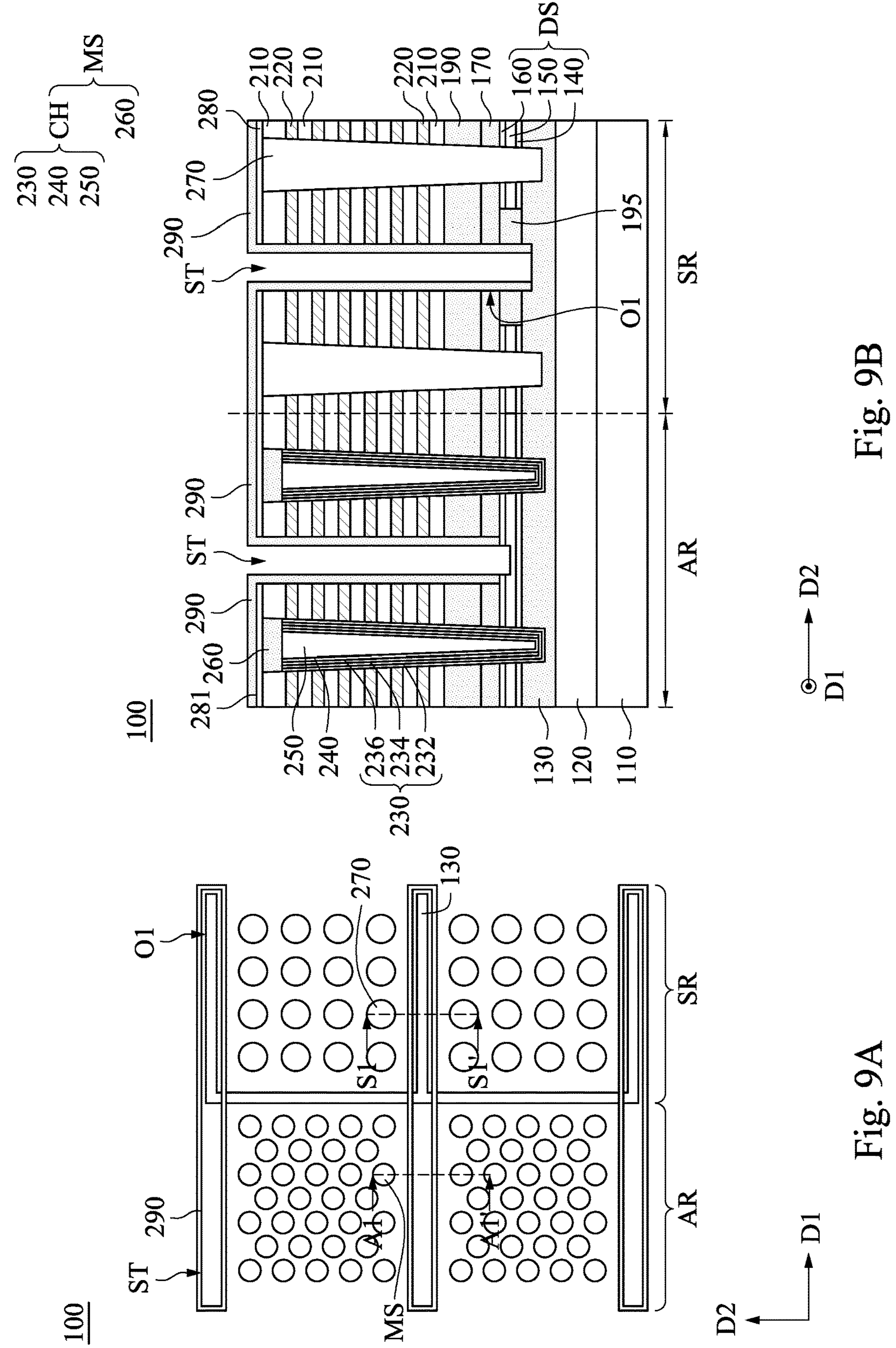

FIG. 9A is a top view of a step of manufacturing the memory device 100, and FIG. 9B is a cross-sectional view of the memory device 100 over the array region AR and the staircase region SR respectively taken along line A1-A1' and line S1-S1' in FIG. 9A. Referring to FIGS. 9A and 9B, a protective layer 290 is conformally formed on the structure of FIGS. 8A and 8B. In greater details, the protective layer 290 is formed on a top surface 281 of the isolation layer 280, the sidewalls of the dielectric layers 210, the sidewalls of the sacrificial material layers 220, sidewalls of the blocking layer 190 and the sidewalls of the second conductive layer 170. In some embodiments, with respect to the array region AR, the protective layer 290 is formed on and in contact with the third dielectric layer of the dielectric stack structure DS. The protective layer 290 is configured to prevent the sidewalls of the slit trenches ST (e.g., the sidewalls of the dielectric layers 210 and the sidewalls of the sacrificial material layers 220) from damaging in subsequent etching processes (e.g., etching process of the dielectric stack structure DS in FIGS. 10A-11B). In some embodiments, with respect to the staircase region SR, the protective layer 290 is formed on the top surface of the first conductive layer 130 and the sidewall of the blocking structures 195, and the protective layer 290 is in contact with the first conductive layer 130 and the blocking structures 195. In some embodiments, the protective layer 290 includes semiconductor materials (e.g., polysilicon). In some embodiments, the protective layer 290, the second conductive layer 170 and/or the first conductive layer 130 include the same material.

After forming the protective layer 290, a bottom portion of the protective layer 290 is etched to expose the dielectric stack structure DS over the array region AR and expose the first conductive layer 130 over the staircase region SR. In some embodiments, etching the protective layer 290 is performed by using a dry etching process, a wet etching process, or a combination thereof. In some embodiments, the third dielectric layer 160 of the dielectric stack structure DS over the array region AR is etched to expose underlying second dielectric layer 150 of the dielectric stack structure DS. In some embodiments, a portion of the second dielectric layer 150 of the dielectric stack structure DS is etched such that a sidewall and a surface of the second dielectric layer 150 are exposed. Since the blocking structures 195 over the staircase region SR protects the adjacent dielectric stack structure DS, the dielectric stack structure DS is not exposed (i.e., covered by the blocking structures 195) during etching the protective layer 290. Further, a damage of the support pillar structure 270 during etching the dielectric stack structure DS (i.e., the etching processes in FIGS. 10A-10B and 11A-11B) will be avoided or prevented, thereby avoiding deformation or collapse problems.

Figures 10A, 10B:
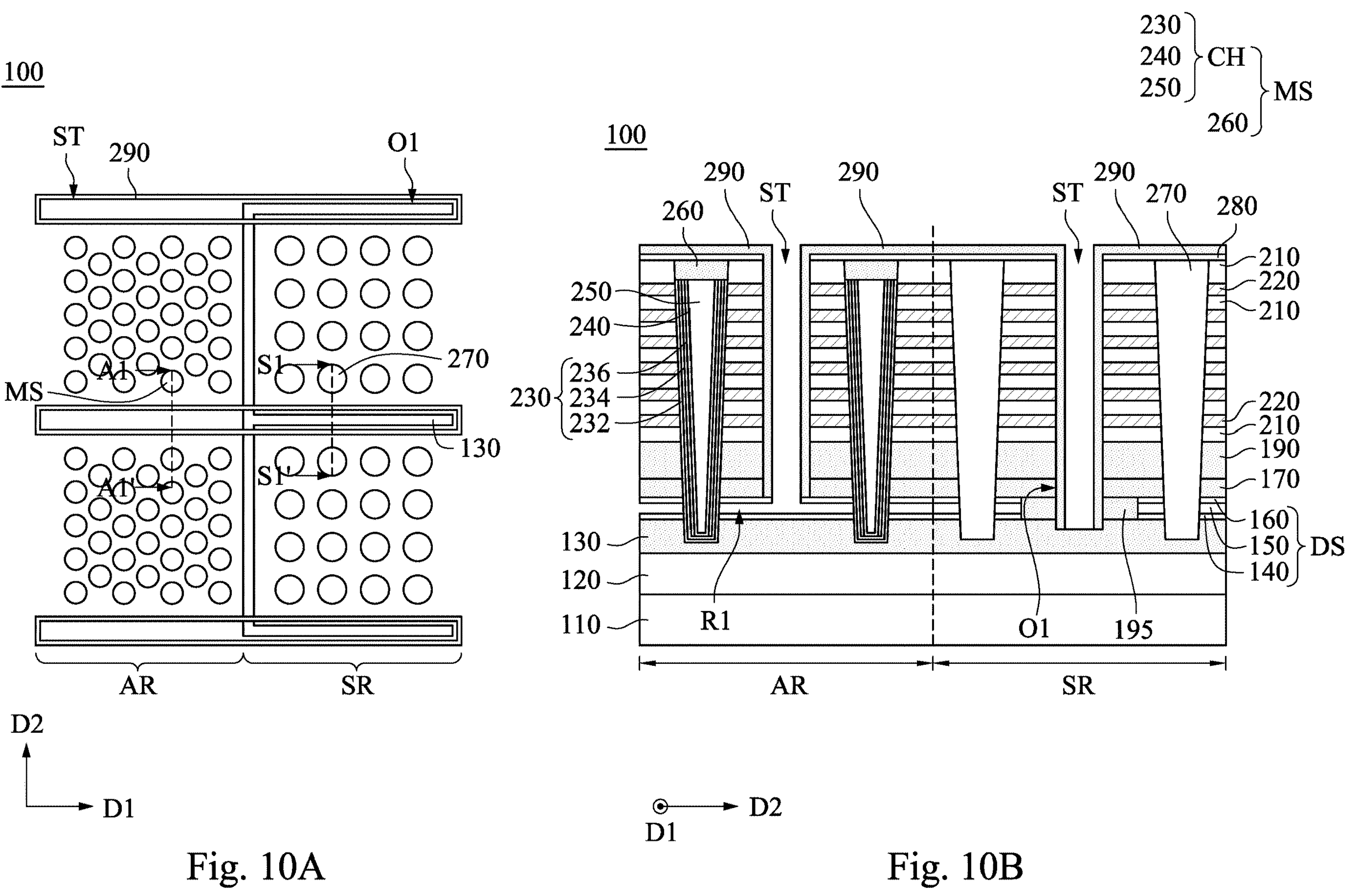

FIG. 10A is a top view of a step of manufacturing the memory device 100, and FIG. 10B is a cross-sectional view of the memory device 100 over the array region AR and the staircase region SR respectively taken along line A1-A1' and line S1-S1' in FIG. 10A. Referring to FIGS. 10A and 10B, an entirety of the second dielectric layer 150 of the dielectric stack structure DS over the array region AR is removed to form a recess R1. The recess R1 exposes the first dielectric layer 140 and the third dielectric layer 160 of the dielectric stack structure DS. In some embodiments, as shown in FIG. 10B, the recess R1 is communicated with the slit trenches ST. In some embodiments, the second dielectric layer 150 of the dielectric stack structure DS is removed using a wet etching process, in which the wet etching process may use phosphoric acid solution or other suitable acidic etching solutions.

Figures 11A, 11B:
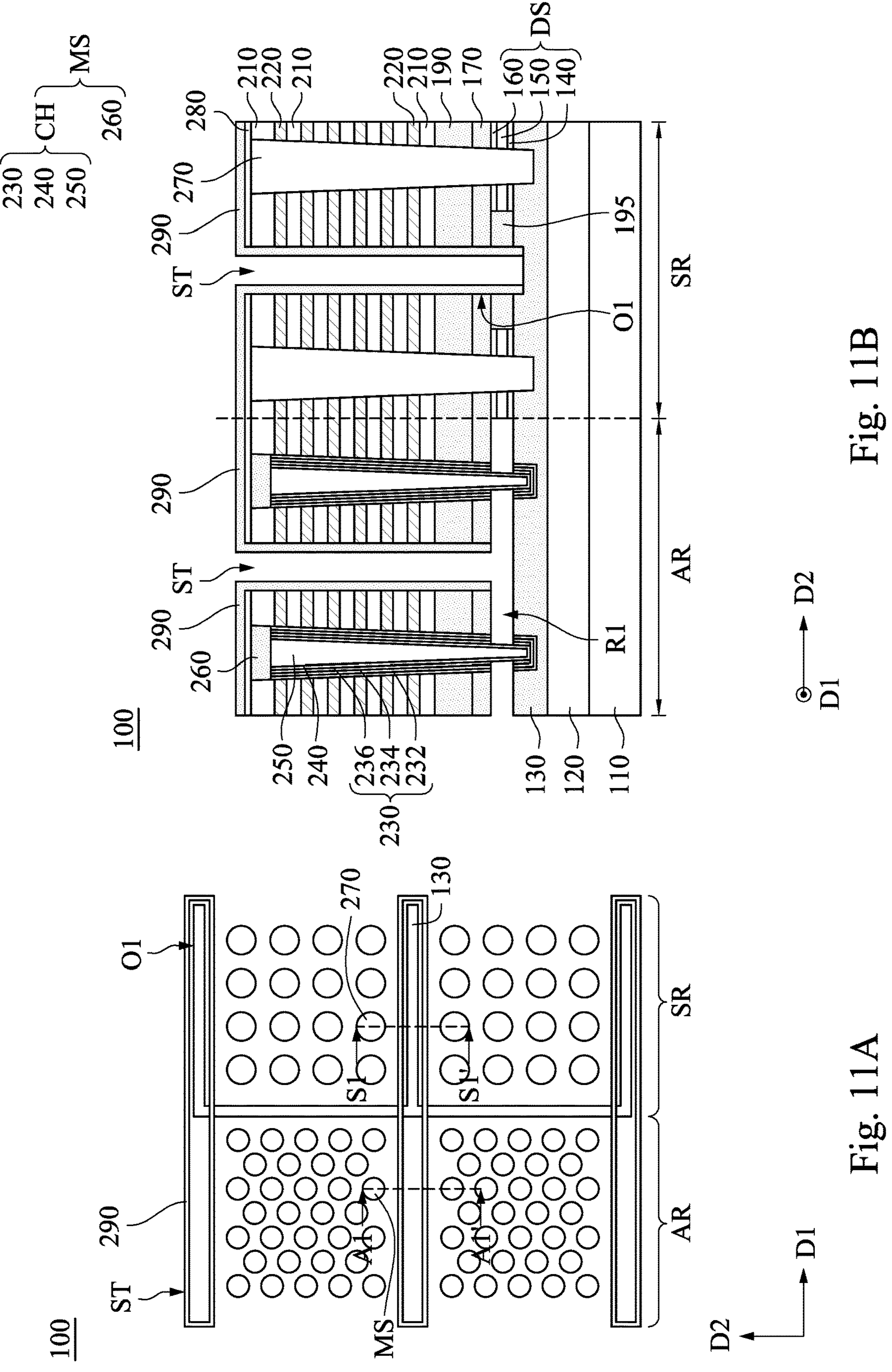

FIG. 11A is a top view of a step of manufacturing the memory device 100, and FIG. 11B is a cross-sectional view of the memory device 100 over the array region AR and the staircase region SR respectively taken along line A1-A1' and line S1-S1' in FIG. 11A. Referring to FIGS. 11A and 11B, an entirety of the first dielectric layer 140 and the third dielectric layer 160 of the dielectric stack structure DS over the array region AR is removed to expand the recess R1. The memory element 230 of the memory structure MS is etched through the recess R1 to expose the channel layer 240 over the array region AR. The recess R1 further exposes the first conductive layer 130 and the second conductive layer 170 over the array region AR. In some embodiments, first dielectric layer 140 and the third dielectric layer 160 of the dielectric stack structure DS and the memory element 230 are etched by using a dry etching process, a wet etching process, or a combination thereof.

Figures 12A, 12B:
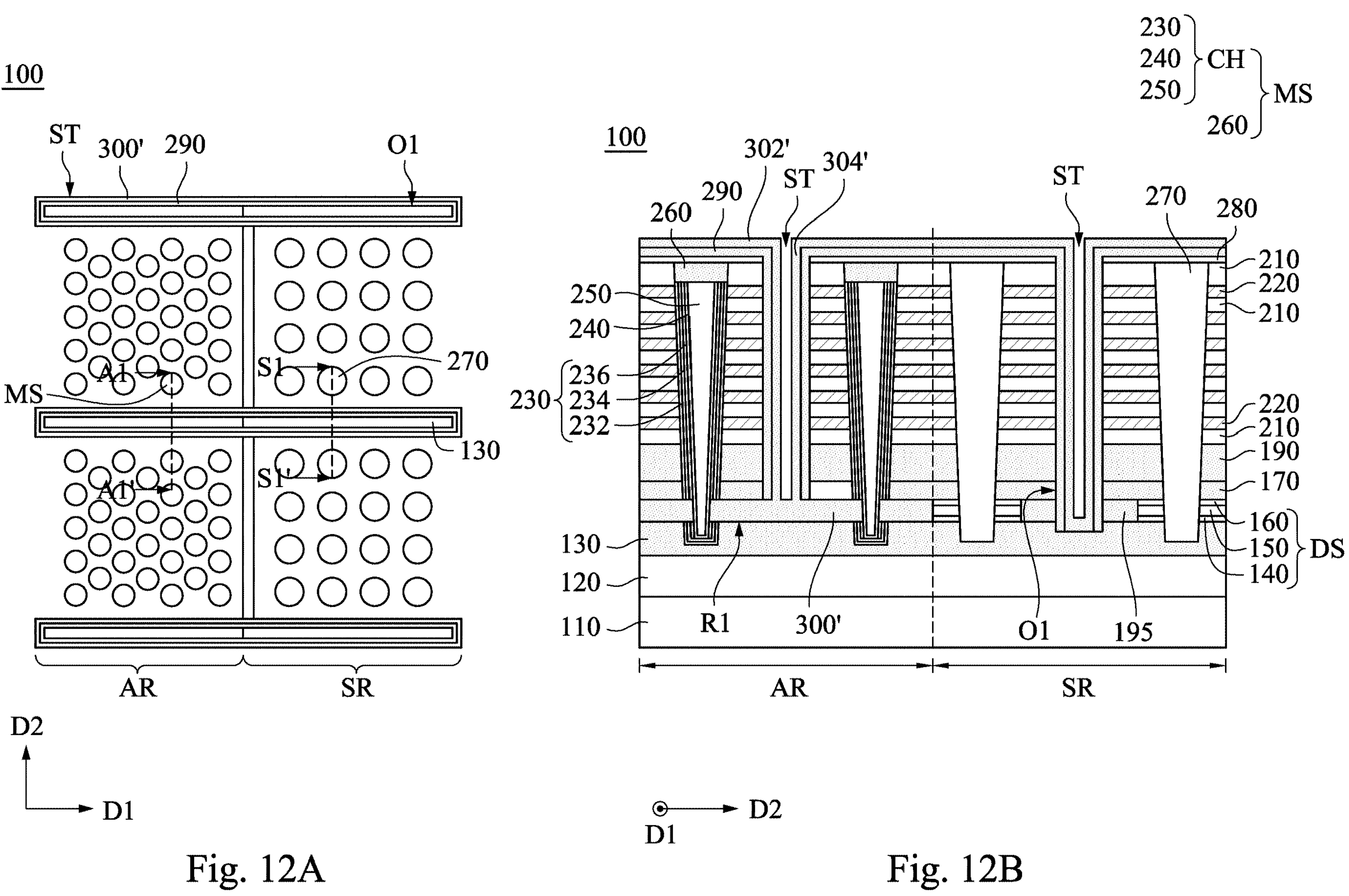

FIG. 12A is a top view of a step of manufacturing the memory device 100, and FIG. 12B is a cross-sectional view of the memory device 100 over the array region AR and the staircase region SR respectively taken along line A1-A1' and line S1-S1' in FIG. 12A. Referring to FIGS. 12A and 12B, a conductive structure 300' is filled in the recess R1. Also, the conductive structure 300' is formed on sidewalls of the slit trenches ST, but the slit trenches ST are not entirely filled by the conductive structure 300'. In some embodiments, the conductive structure 300' is conformally formed on the protective layer 290. Hence, the conductive structure 300' includes a first portion 302' over the isolation layer 280 and a second portion 304' on the sidewalls of the slit trenches ST. In some embodiments, filling the conductive structure 300' in the recess R1 is performed by using a chemical vapor deposition, an atomic layer deposition, a physical vapor deposition, or other suitable deposition processes. In some embodiments, the conductive structure 300' includes semiconductor materials (e.g., polysilicon). In some embodiments, the conductive structure 300', the protective layer 290, the second conductive layer 170 and/or the first conductive layer 130 include the same material.

Figures 13A, 13B:
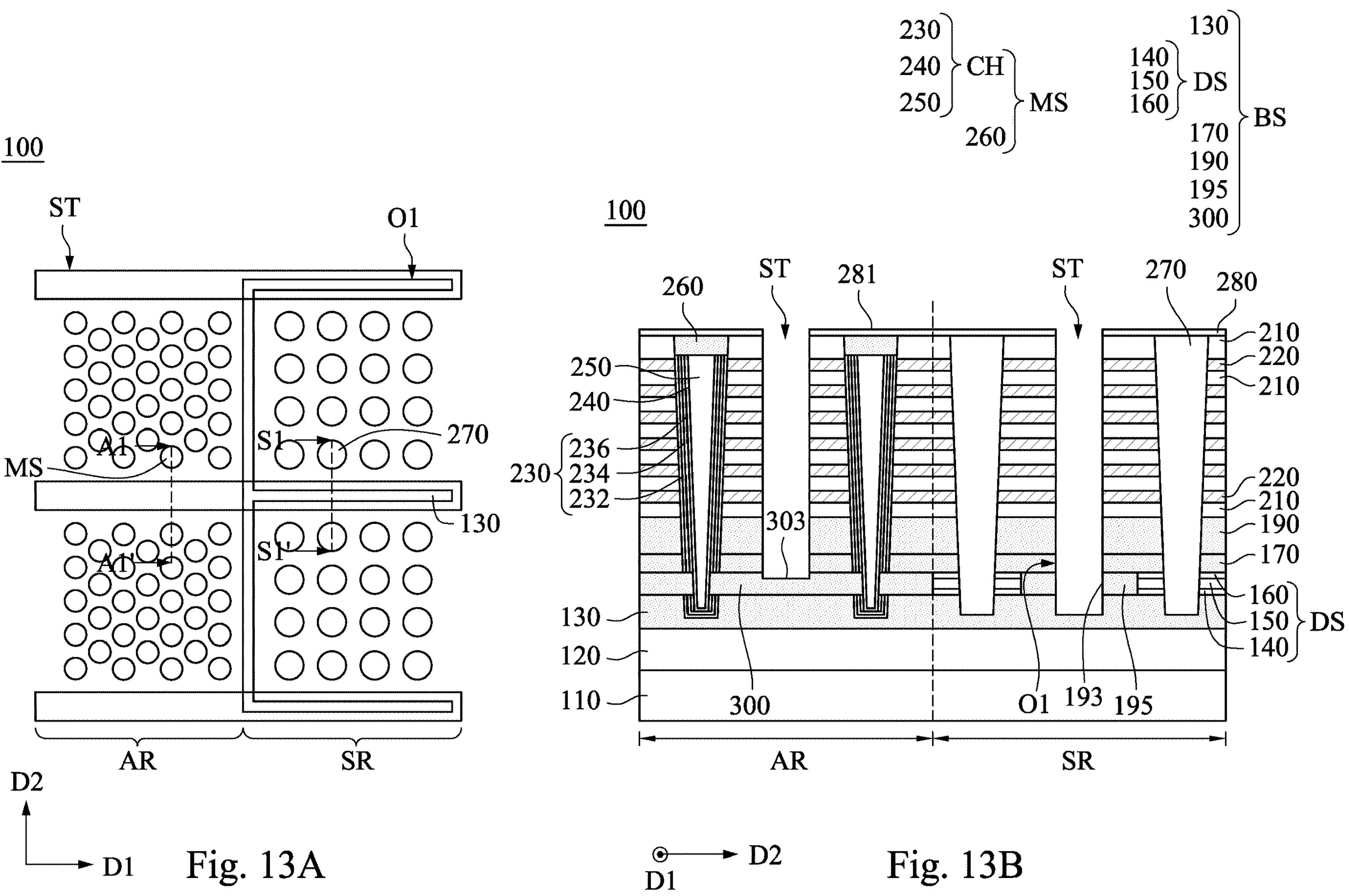

FIG. 13A is a top view of a step of manufacturing the memory device 100, and FIG. 13B is a cross-sectional view of the memory device 100 over the array region AR and the staircase region SR respectively taken along line A1-A1' and line S1-S1' in FIG. 13A. Referring to FIGS. 13A and 13B, the conductive structure 300' is patterned to form (or define) the bottom electrode layer 300 electrically connected to the channel layer 240 of the memory structure MS. In greater details, as shown in FIGS. 12B and 13B, an etching process is performed to remove the first portion 302' of the conductive structure 300' over the isolation layer 280 and the second portion 304' of the conductive structure 300' on the sidewalls of the slit trenches ST. In some embodiments, as shown in FIG. 13B, a surface 303 of the bottom electrode layer 300 is exposed through the slit trenches ST and the surface 303 of the bottom electrode layer 300 is below the bottom surface 175 of the second conductive layer 170. In some embodiments, the etching process is performed such that an entirety of the conductive structure 300' over the staircase region SR is removed, and thus the first conductive layer 130 over the staircase region SR is exposed. Further, an entirety of the protective layer 290 over the array region AR and the staircase region SR is removed. Hence, the top surface 281 of the isolation layer 280, the sidewalls of the dielectric layer 210, the sidewalls of the sacrificial material layers 220, the sidewalls of the blocking layer 190 and the sidewalls of the second conductive layer 170 over the array region AR and the staircase region SR are exposed. In some embodiments, a sidewall 193 of the blocking structure 195 spaced apart from the dielectric stack structure DS is exposed. In some embodiments, since the conductive structure 300' and the protective layer 290 include the same material (e.g., polysilicon or other suitable semiconductor materials), the conductive structure 300' and the protective layer 290 may be removed in a single selective etching process. In some embodiments, the conductive structure 300' and the protective layer 290 are removed using a wet etching process. In some embodiments, the first conductive layer 130, the dielectric stack structure DS, the second conductive layer 170, the blocking layer 190, the blocking structures 195 and the bottom electrode layer 300 are referred as a bottom source structure BS.

Figures 14A, 14B:
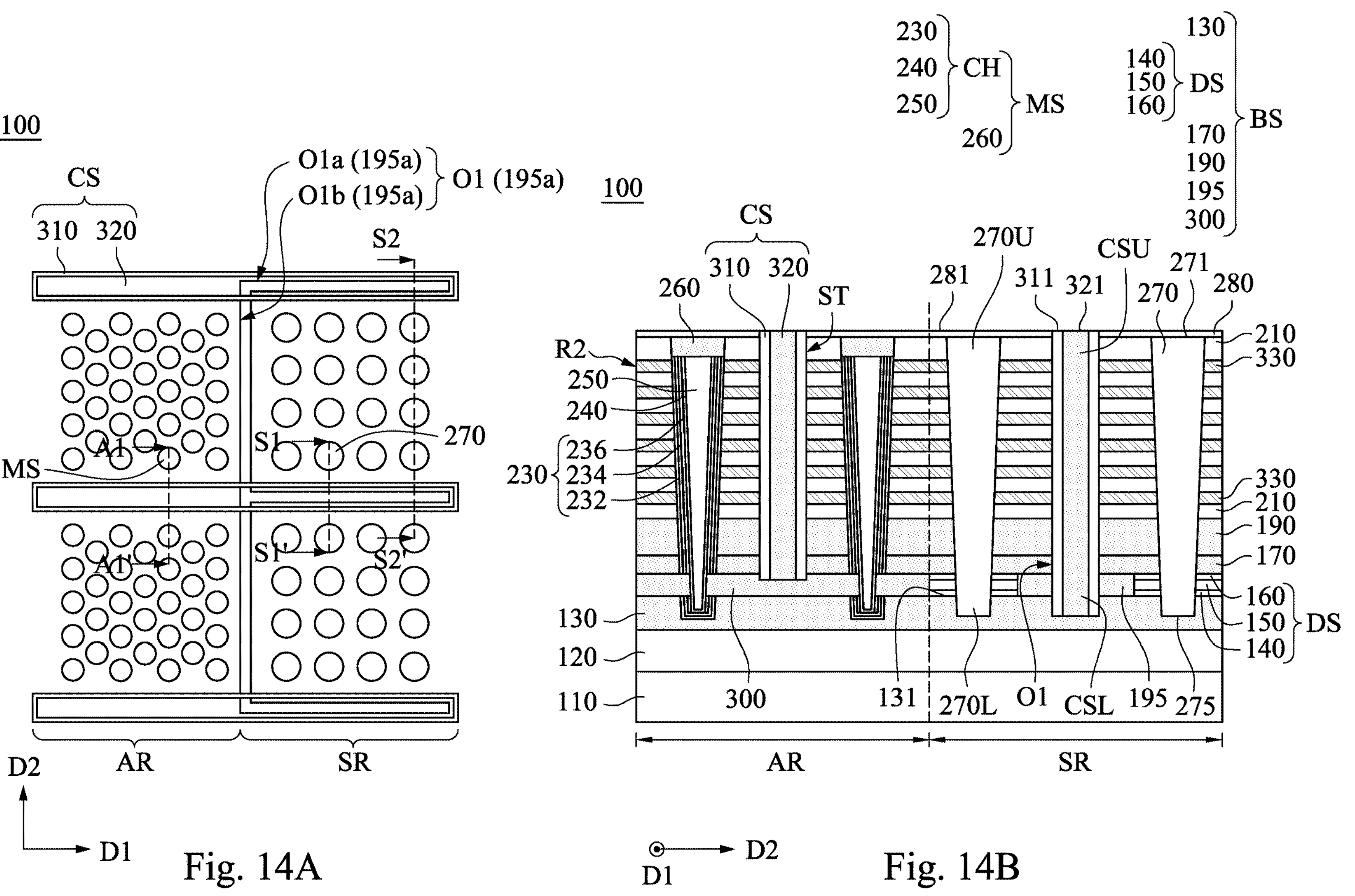
Figure 14C:
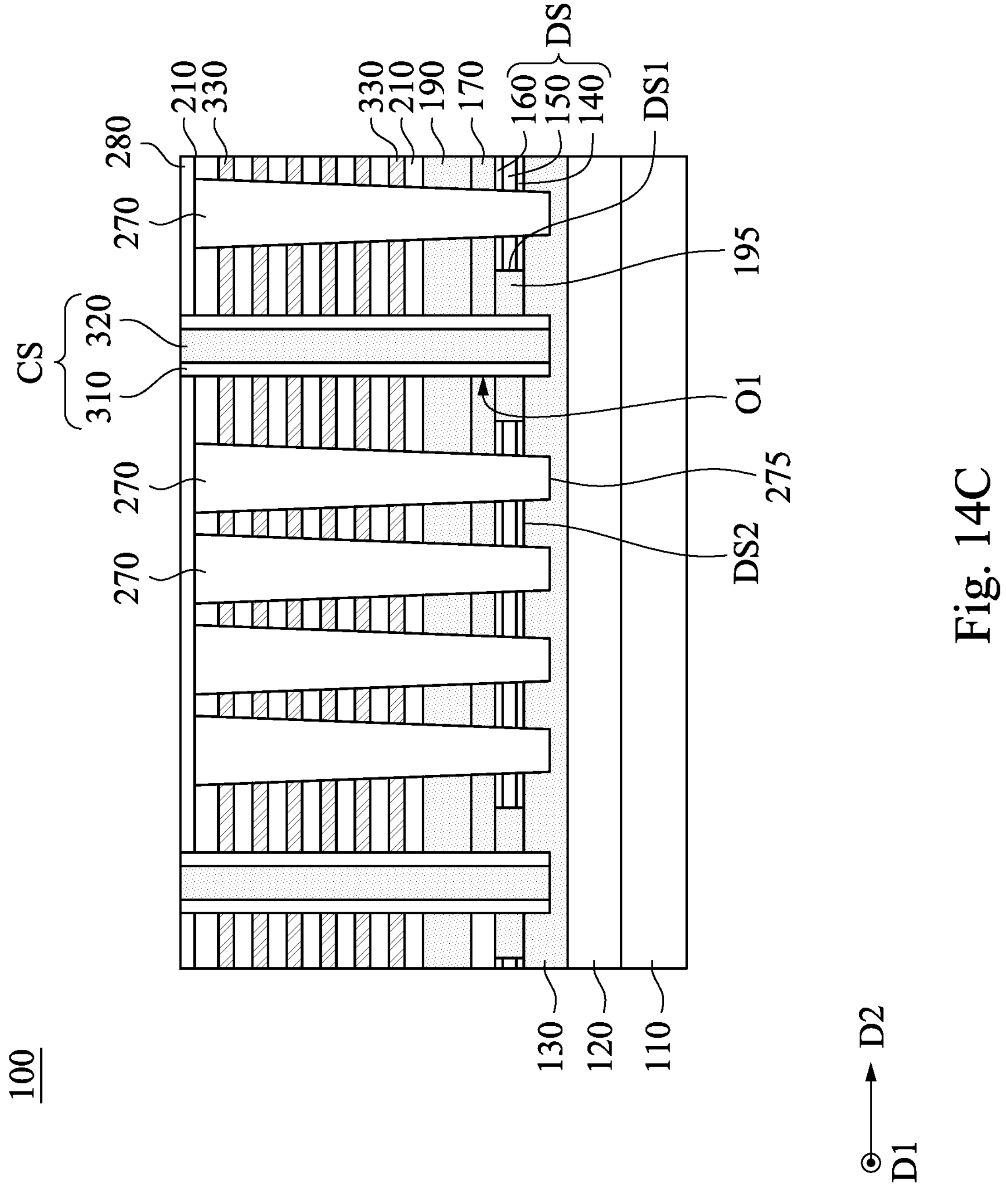
FIG. 14C is a cross-sectional view taking along line S2-S2 of FIG. 14A.

FIG. 14A is a top view of a step of manufacturing the memory device 100, FIG. 14B is a cross-sectional view of the memory device 100 over the array region AR and the staircase region SR respectively taken along line A1-A1' and line S1-S1' in FIG. 14A, and FIG. 14C is a cross-sectional view of the memory device 100 over the staircase region SR taken along line S2-S2' in FIG. 14A. Referring to FIGS. 13A-13B and 14A-14C, the sacrificial material layers 220 are replaced with a plurality of gate layers 330. In greater details, an entirety of the sacrificial material layers 220 is removed to form recesses R2 such that the recesses R2 are communicated with the slit trenches ST. In some embodiments, the sacrificial material layers 220 are removed using a wet etching process, in which the wet etching process may use phosphoric acid solution or other suitable acidic etching solutions. In some embodiments, the support pillar structures 270 provide the structural support to prevent the memory device 100 from collapsing during the removal of the sacrificial material layers 220.

After removing the sacrificial material layers 220 to form the recesses R2, conductive materials are filled in the recesses R2 and then performing an etching process to remove the excess conductive materials so as to form the gate layers 330. The gate layers 330 may be referred to as word lines. Specifically, the gate layers 330 may be used as control gate electrodes of the memory device 100 (in particular with a vertical NAND memory device). In some embodiments, filling conductive materials in the recesses R2 is performed by using a chemical vapor deposition, an atomic layer deposition, a physical vapor deposition, an electroless plating process, or other suitable deposition processes. In some embodiments, the gate layers 330 include metal (e.g, tungsten) or other suitable conductive materials.

After the sacrificial material layers 220 is replaced with the gate layers 330, contact structures CS are formed in the slit trenches ST. In greater details, each of the contact structures CS includes a liner layer 310 and an electrode layer 320. The liner layer 310 may be formed in the slit trench ST by using a deposition process, and then a conductive material is filled in the slit trench ST to form the electrode layer 320. The liner layer 310 may be formed by using a chemical vapor deposition process, an atomic layer deposition process, a physical vapor deposition process or other suitable deposition processes. The liner layer 310 includes oxide (e.g., silicon oxide) or other suitable dielectric materials. In some embodiments, the liner layer 310, the isolation layer 280 and/or the dielectric layers 210 include the same material (e.g., oxide). In some embodiments, the electrode layer 320 is formed by using a chemical vapor deposition process, an atomic layer deposition process, a physical vapor deposition process, or other suitable deposition processes. The electrode layer 320 may include semiconductor material (e.g., polysilicon), metal or other suitable conductive materials. In some embodiments, the electrode layer 320, the conductive plug 260, the bottom electrode layer 300, the first conductive layer 130, the second conductive layer 170 and/or the blocking layer 190 (or the blocking structure 195) include the same material, such as polysilicon.

In some embodiments, a planarization process (e.g., a chemical mechanical polishing process) is performed to remove excess materials of the liner layer 310 and/or the electrode layer 320. For example, the isolation layer 280 serves as an etching stop layer for performing the planarization process, such that a top surface of each of the contact structures CS (i.e., a top surface 321 of the electrode layer 320 and a top surface 311 of the liner layer 310) is substantially coplanar with the top surface 281 of the isolation layer 280.

In some embodiments, the contact structures CS are located on the sidewalls of the gate layers 330, the sidewalls of the dielectric layers 210, the sidewalls of the blocking layer 190 and the sidewalls of the second conductive layer 170. In other words, the contact structures CS downwards penetrate through the gate layers 330, the dielectric layers 210, the blocking layer 190 and the second conductive layer 170. Further, with respect to the staircase region SR, each of the contact structures CS has a portion embedded in the first conductive layer 130. In some embodiments, the liner layer 310 is configured to separate the electrode layer 320 from the gate layers 330 to avoid an electrical contact between the electrode layer 320 and the gate layers 330. The electrode layers 320 of the contact structures CS are electrically connected to the bottom electrode layer 300 over the array region AR, and the electrode layers 320 of the contact structures CS are electrically connected to the first conductive layer 130 over the staircase region SR.

In some embodiments, the memory device 100 includes the substrate 110, the bottom source structure BS, the gate layers 330, the dielectric layers 210, the contact structures CS and the support pillar structures 270. The gate layers 330 and the dielectric layers 210 are alternately stacked over the bottom source structure BS. The contact structures CS downwards penetrate through the gate layers 330 and the dielectric layers 210 and extends to the bottom source structure BS. The support pillar structures 270 downwards penetrate through the gate layers 330 and the dielectric layers 210 and extend to the bottom source structure BS. The bottom source structure BS is located over the substrate 110, and the bottom source structure BS includes the bottom electrode layer 300, the first conductive layer 130, the dielectric stack structure DS, the second conductive layer 170, the blocking layer 190 and the blocking structure 195. FIG. 14C is a cross-sectional view of the memory device 100 over the staircase region SR taken along line S2-S2' in FIG. 14A. In some embodiments, as shown in FIG. 14C, the dielectric stack structure DS is laterally between two adjacent of the support pillar structures 270 along the second direction D2. The blocking structures 195 of the bottom source structure BS is laterally between one of the support pillar structures 270 and one of the contact structures CS along the second direction D2. In other words, with respect to the staircase region SR, the dielectric stack structure DS surrounds each of the support pillar structures 270, and the blocking structures 195 surround each of the contact structures CS.

In some embodiments, as shown in FIG. 14C, each of the contact structures CS includes an upper portion CSU and a lower portion CSL. With respect to the staircase region SR, the upper portion CSU is located in the isolation layer 280, the dielectric layers 210 and the gate layers 330, while the lower portion CSL is located in the blocking layer 190, the second conductive layer 170, the blocking structure 195 and the first conductive layer 130. With respect to the staircase region SR, the lower portion CSL is in contact with and surrounded by the blocking structures 195. Specifically, with respect to the staircase region SR, two opposite sidewalls of the lower portion CSL of each of the contact structures CS are in contact with the blocking structures 195.

In some embodiments, as shown in FIG. 14C, each of the support pillar structures 270 includes an upper portion 270U and a lower portion 270L. The upper portion 270U is located in the dielectric layers 210 and the gate layers 330, while the lower portion 270L is located in the blocking layer 190, the second conductive layer 170, the dielectric stack structure DS and the first conductive layer 130. The lower portion 270L is in contact with and surrounded by the dielectric stack structure DS. Each of the support pillar structures 270 has a top surface 271 below the top surface 281 of the isolation layer 280 and a bottom surface 275 below the top surface 131 of the first conductive layer 130. In some embodiments, the bottom surface 275 of the support pillar structures 270 is below a bottom surface DS2 of the dielectric stack structure DS. In some embodiments, the dielectric stack structure DS of the bottom source structure BS is laterally between the lower portion CSL of one of the contact structures CS and the lower portion 270L of one of the support pillar structures 270 along the second direction D2.

In some embodiments, as shown in FIG. 14B and FIG. 14C, the dielectric stack structure DS is vertically between the first conductive layer 130 and the second conductive layer 170 along the direction perpendicular to a plane defined by the first direction D1 and the second direction D2. The blocking structures 195 are vertically between the first conductive layer 130 and the second conductive layer 170 along the direction perpendicular to a plane defined by the first direction D1 and the second direction D2. The blocking structures 195 are laterally adjacent to the dielectric stack structure DS along the second direction D2. In some embodiments, with respect to the staircase region SR, each of the blocking structures 195 is in contact with a sidewall DS1 the dielectric stack structure DS and a sidewall of one of the contact structures CS. Specifically, with respect to the staircase region SR, two opposite sidewalls of each of the blocking structures 195 are respectively in contact with the dielectric stack structure DS and the lower portion CSL of one of the contact structures CS. In some embodiments, with respect to the staircase region SR, each of the blocking structures 195 is in contact with the lower portion CSL of one of the contact structures CS and spaced apart from the lower portion 270L of one of the support pillar structures 270. In other words, the blocking structures 195 are separated from the support pillar structures 270 by the dielectric stack structure DS. In some embodiments, the dielectric stack structure DS is in contact with one of the blocking structures 195 and one of the support pillar structures 270. In some embodiments, as shown in FIG. 14B, the dielectric stack structure DS is in contact with the lower portion 270L of each of the support pillar structures 270 and spaced apart from the lower portion CSL of each of the contact structures CS. In other words, the dielectric stack structure DS is separated from the contact structures CS by the blocking structures 195. The dielectric stack structure DS is laterally adjacent to the blocking structure 195.

In some embodiments, as shown in FIG. 14B, the memory device 100 further includes the memory structures MS downwards penetrating through the dielectric layers 210, the gate layers 330, the blocking layer 190 and the second conductive layer 170 over the array region AR. The memory structures MS are spaced apart from the support pillar structures 270. In other words, the memory structures MS are located over the array region AR of the substrate 110, while the support pillar structures 270 are located over the staircase region SR of the substrate 110. The bottom electrode layer 300 of the bottom source structure BS is electrically connected to the memory structures MS and the contact structures CS.

In some embodiments, as shown in FIG. 14A, the memory structures MS are arranged in multiple rows along the second direction D2, in which the memory structures MS may be referred as vertical NAND memory strings. The contact structures CS extend along the first direction D1 over the array region AR and the staircase region SR. The array region AR includes the memory structures MS and the staircase region SR includes the support pillar structures 270. The contact structures CS are configured to divide the memory device 100 into multiple blocks. For example, the memory structures MS and the support pillar structures 270 between the two adjacent contact structures CS are referred as one block. In some embodiments, as shown in FIG. 7A and FIG. 14A, the blocking structure 195 inherits the geometry of the opening O1. Specifically, the blocking structure 195 includes a first portion 195*a* corresponding to the first portion O1*a* of the opening O1 and a second portion 195*b* corresponding to the second portion O1*b* of the opening O1. That is, the first portion 195*a* of the blocking structure 195 has a profile substantially the same as the profile of the first portion O1*a* of the opening O1, and the second portion 195*b* of the blocking structure 195 has a profile substantially the same as the profile of the second portion O1*b* of the opening O1. In some embodiments, as shown in FIG. 7A and FIG. 14A, the first portion 195*a* of the blocking structure 195 is located adjacent to a section of one of the contact structures CS along the first direction D1. The second portion 195*b* of the blocking structure 195 extends along the second direction D2 perpendicular to the first direction D1.

According to the aforementioned embodiments of the present disclosure, since the dielectric stack structure surrounds each of the support pillar structures and the blocking structure is located between one of the support pillar structures and the contact structure, the damage of the support pillar structure during etching processes (e.g., etching the dielectric stack structure to expose the channel layer of the memory structure) can be avoided or prevented, thereby avoiding deformation or collapse problems.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A memory device, comprising:

a substrate;

a bottom source structure disposed over the substrate, wherein the bottom source structure comprises a bottom electrode layer, a dielectric stack structure, a blocking structure, a first conductive layer, and a second conductive layer over the first conductive layer;

a plurality of gate layers and a plurality of dielectric layers alternately stacked over the bottom source structure;

a contact structure penetrating through the gate layers and the dielectric layers and extending to the bottom source structure; and a plurality of support pillar structures penetrating through the gate layers and the dielectric layers and extending to the bottom source structure, wherein the dielectric stack structure of the bottom source structure surrounds each of the support pillar structures, wherein the blocking structure of the bottom source structure is disposed between one of the support pillar structures and the contact structure, wherein the second conductive layer covers an entirety of a top surface of the blocking structure.

2. The memory device of claim 1, wherein the blocking structure is in contact with the dielectric stack structure and the contact structure.

3. The memory device of claim 1, wherein the blocking structure is disposed between the first conductive layer and the second conductive layer.

4. The memory device of claim 1, wherein the contact structure extends along a first direction, and a first portion of the blocking structure is adjacent to a section of the contact structure along the first direction.

5. The memory device of claim 4, wherein the blocking structure further comprises a second portion extending along a second direction perpendicular to the first direction.

6. The memory device of claim 4, further comprising:

a memory structure penetrating through the gate layers and the dielectric layers over an array region, wherein the contact structure extends along the first direction over the array region and a staircase region including the support pillar structures.

7. The memory device of claim 6, wherein the memory structure is electrically connected to the bottom electrode layer.

8. The memory device of claim 1, wherein the dielectric stack structure of the bottom source structure comprises a first oxide layer, a nitride layer over the first oxide layer, and a second oxide layer over the nitride layer.

9. A memory device, comprising:

a substrate;

a bottom source structure disposed over the substrate, wherein the bottom source structure comprises a bottom electrode layer, a dielectric stack structure, a blocking structure laterally adjacent to the dielectric stack structure, a first conductive layer, and a second conductive layer over the first conductive layer, a plurality of gate layers and a plurality of dielectric layers alternately stacked over the bottom source structure;

a contact structure penetrating through the gate layers and the dielectric layers and extending to the bottom source structure; and a support pillar structure penetrating through the gate layers and the dielectric layers and extending to the bottom source structure, wherein the dielectric stack structure of the bottom source structure is laterally between a lower portion of the contact structure and a lower portion of the support pillar structure, wherein the second conductive layer covers an entirety of a top surface of the blocking structure.

10. The memory device of claim 9, wherein the dielectric stack structure is vertically between the first conductive layer and the second conductive layer.

11. The memory device of claim 9, wherein the blocking structure of the bottom source structure surrounds the contact structure.

12. The memory device of claim 9, wherein the blocking structure of the bottom source structure is in contact with the lower portion of the contact structure and spaced apart from the lower portion of the support pillar structure.

13. The memory device of claim 9, wherein a bottom surface of the support pillar structure is below a bottom surface of the dielectric stack structure.

14. The memory device of claim 9, wherein the dielectric stack structure is in contact with the lower portion of the support pillar structure.

* * * * *